(12) United States Patent
Chen et al.

(10) Patent No.: US 12,469,768 B2
(45) Date of Patent: Nov. 11, 2025

(54) SEMICONDUCTOR PACKAGE STRUCTURE AND METHOD FOR FORMING THE SAME

(71) Applicant: TAIWAN SEMICONDUCTOR MANUFACTURING COMPANY LTD., Hsinchu (TW)

(72) Inventors: Kuo Wen Chen, Hsinchu (TW); Hsiang-Tai Lu, Hsinchu County (TW); Chih-Hsuan Tai, Taipei (TW); Ming-Chung Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 794 days.

(21) Appl. No.: 17/697,932

(22) Filed: Mar. 18, 2022

(65) Prior Publication Data

US 2023/0298970 A1 Sep. 21, 2023

(51) Int. Cl.
- *H01L 23/48* (2006.01)
- *H01L 21/768* (2006.01)
- *H01L 23/522* (2006.01)
- *H10D 1/66* (2025.01)

(52) U.S. Cl.
CPC ...... *H01L 23/481* (2013.01); *H01L 21/76898* (2013.01); *H01L 23/5223* (2013.01); *H10D 1/66* (2025.01)

(58) Field of Classification Search
None
See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 * | 8/2014 | Chen | H01L 23/485 |
| | | | 257/773 |
| 8,803,316 B2 | 8/2014 | Lin et al. | |
| 8,993,380 B2 | 3/2015 | Hou et al. | |
| 9,196,672 B2 * | 11/2015 | Tran | H10D 1/665 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,401,353 B2 * | 7/2016 | Ramachandran | H10D 89/611 |
| 9,425,126 B2 | 8/2016 | Kuo et al. | |
| 9,443,783 B2 | 9/2016 | Lin et al. | |

(Continued)

FOREIGN PATENT DOCUMENTS

| | | |
|---|---|---|
| CN | 103346141 A | 10/2013 |
| TW | 202002103 A | 1/2020 |

OTHER PUBLICATIONS

U.S. Pat. No. 9,520,462 B1 is the US counterpart of CN 103346141 A.

(Continued)

*Primary Examiner* — Long Pham
(74) *Attorney, Agent, or Firm* — WPAT LAW; Anthony King

(57) ABSTRACT

A semiconductor structure includes a substrate, a capacitor disposed in the substrate, an interconnect structure disposed over the substrate, and a first doped region disposed in the substrate. The interconnect structure includes a first via structure coupled to the substrate, and a second via structure coupled to the capacitor. The first doped region is disposed under the first via structure. The first doped region includes p-type or n-type dopants.

20 Claims, 21 Drawing Sheets

(56) References Cited

U.S. PATENT DOCUMENTS

| | | | |
|---|---|---|---|
| 9,496,189 B2 | 11/2016 | Yu et al. | |
| 9,520,462 B1 * | 12/2016 | Tran | H10D 1/665 |
| 10,879,183 B2 * | 12/2020 | Wang | H01L 25/50 |

OTHER PUBLICATIONS

U.S. Appl. No. 10/879,183 B2 is the US counterpart of TW 202002103 A.

* cited by examiner

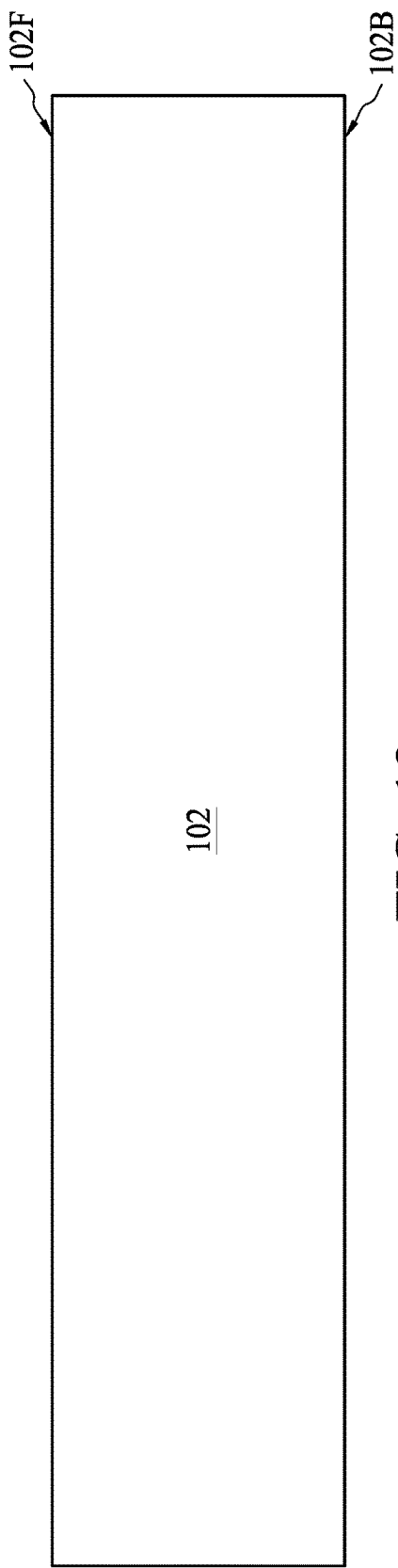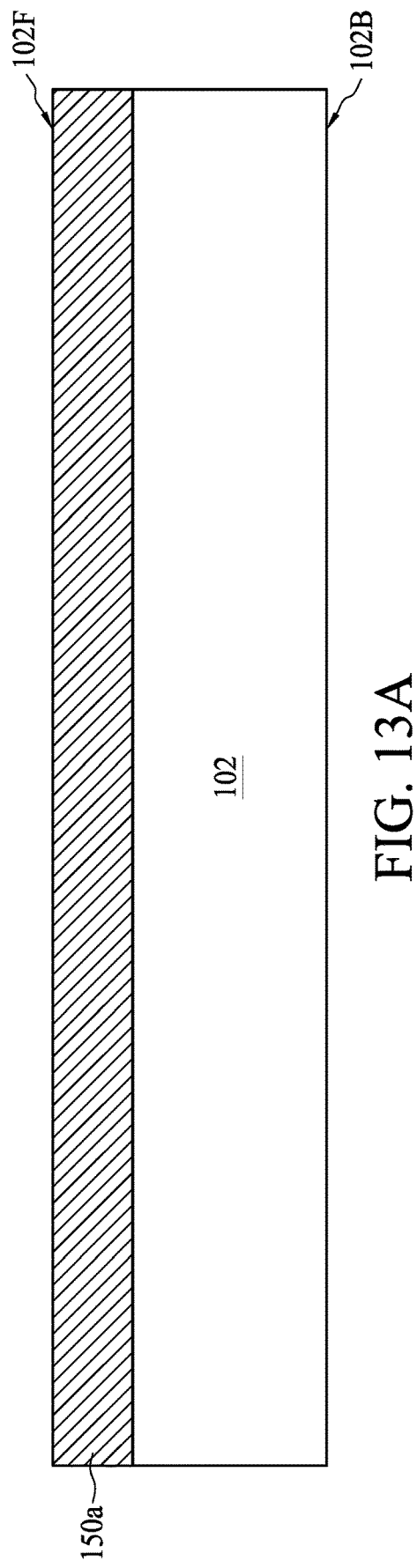
FIG. 12
FIG. 13A

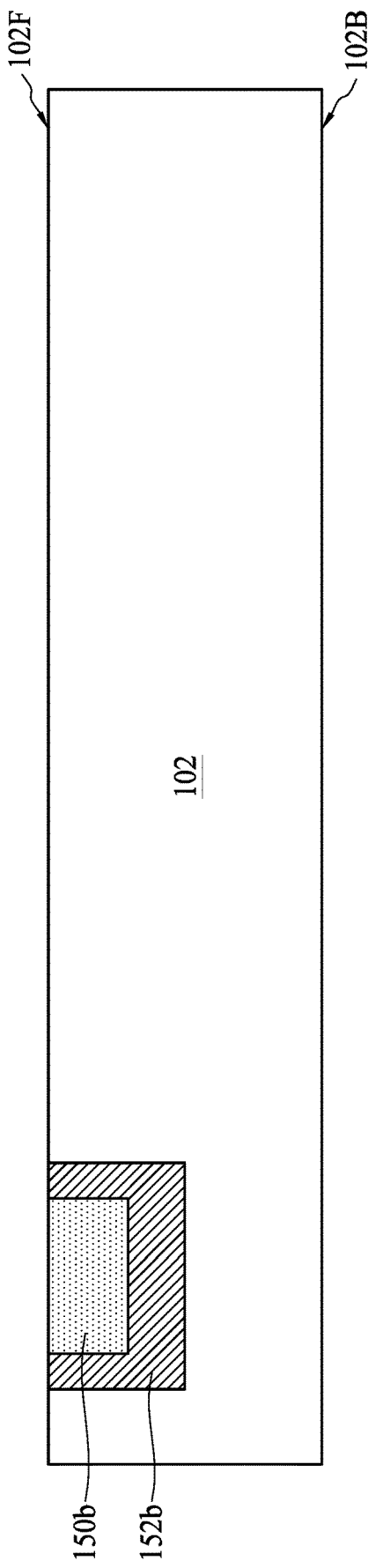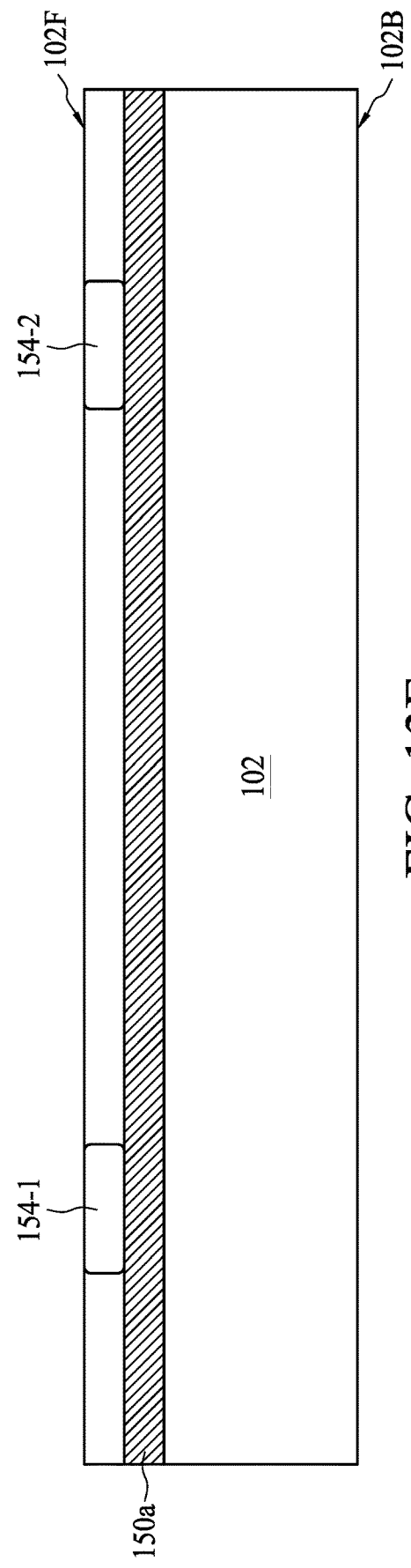

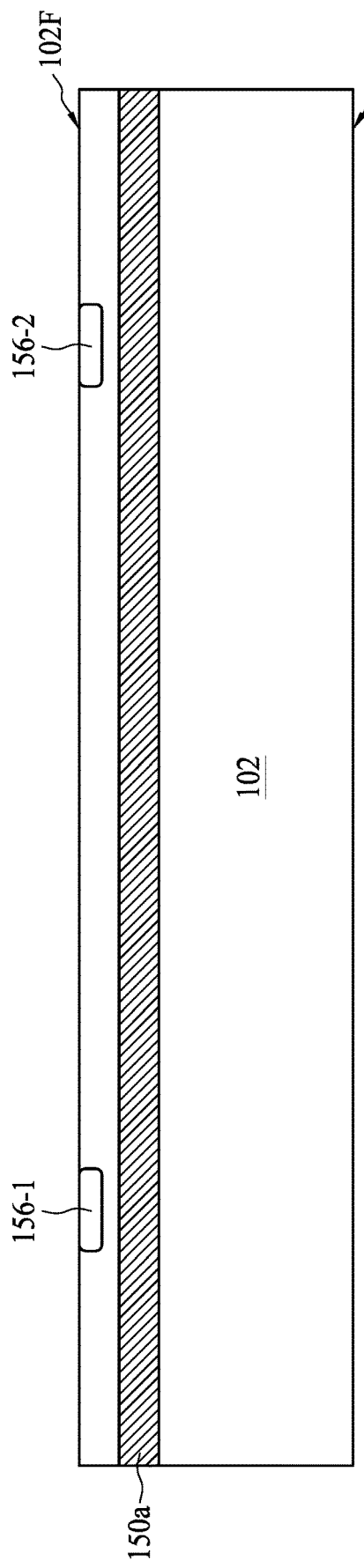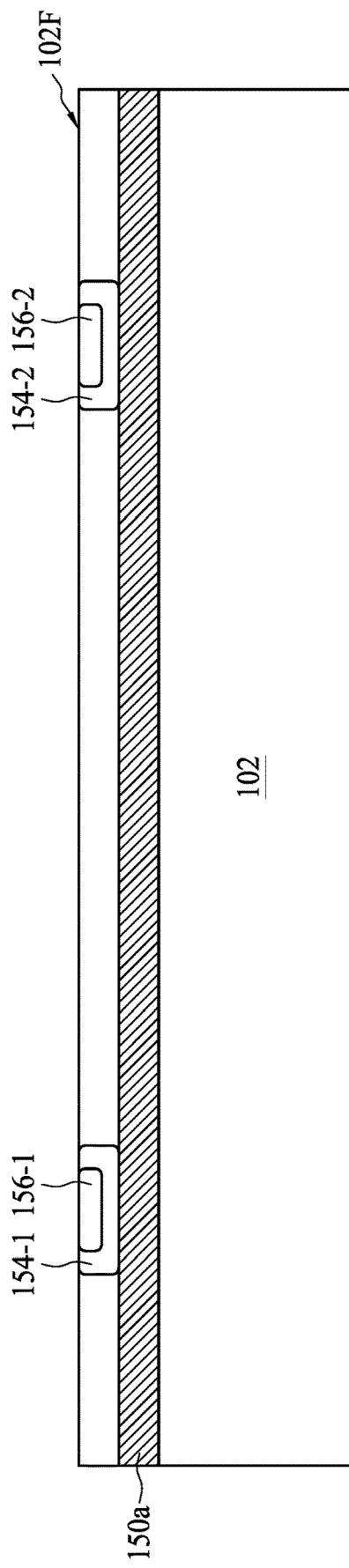

SEMICONDUCTOR PACKAGE STRUCTURE AND METHOD FOR FORMING THE SAME

BACKGROUND

Since the invention of integrated circuits, the semiconductor industry has experienced continuous rapid growth due to constant improvements in the integration density of various electronic components (i.e., transistors, diodes, resistors, capacitors, etc.). Such integration improvements are essentially two-dimensional (21)) in nature, in that the volume occupied by the integrated components is essentially on the surface of the semiconductor wafer. One limitation of a 2D package is a minimum size needed to include the components. Another limitation is that when more devices included in one chip, more complex routing designs are required. As quantities and lengths of interconnections increase, both circuit RC delay and power consumption increase.

In an attempt to further increase circuit density, three-dimensional (3D) ICs have been investigated. One 3D package uses package-on-package (PoP) or interposer technique for stacking dies. When using the interposer as the packaging substrate, the package is referred to as a 2D-like (sometimes referred to as 2.5D) package.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

FIGS. 12 to 13G are schematic drawings illustrating a portion of a semiconductor package structure in various stages according to aspects of the present disclosure in one or more embodiments.

DETAILED DESCRIPTION OF THE DISCLOSURE

Figure 1:
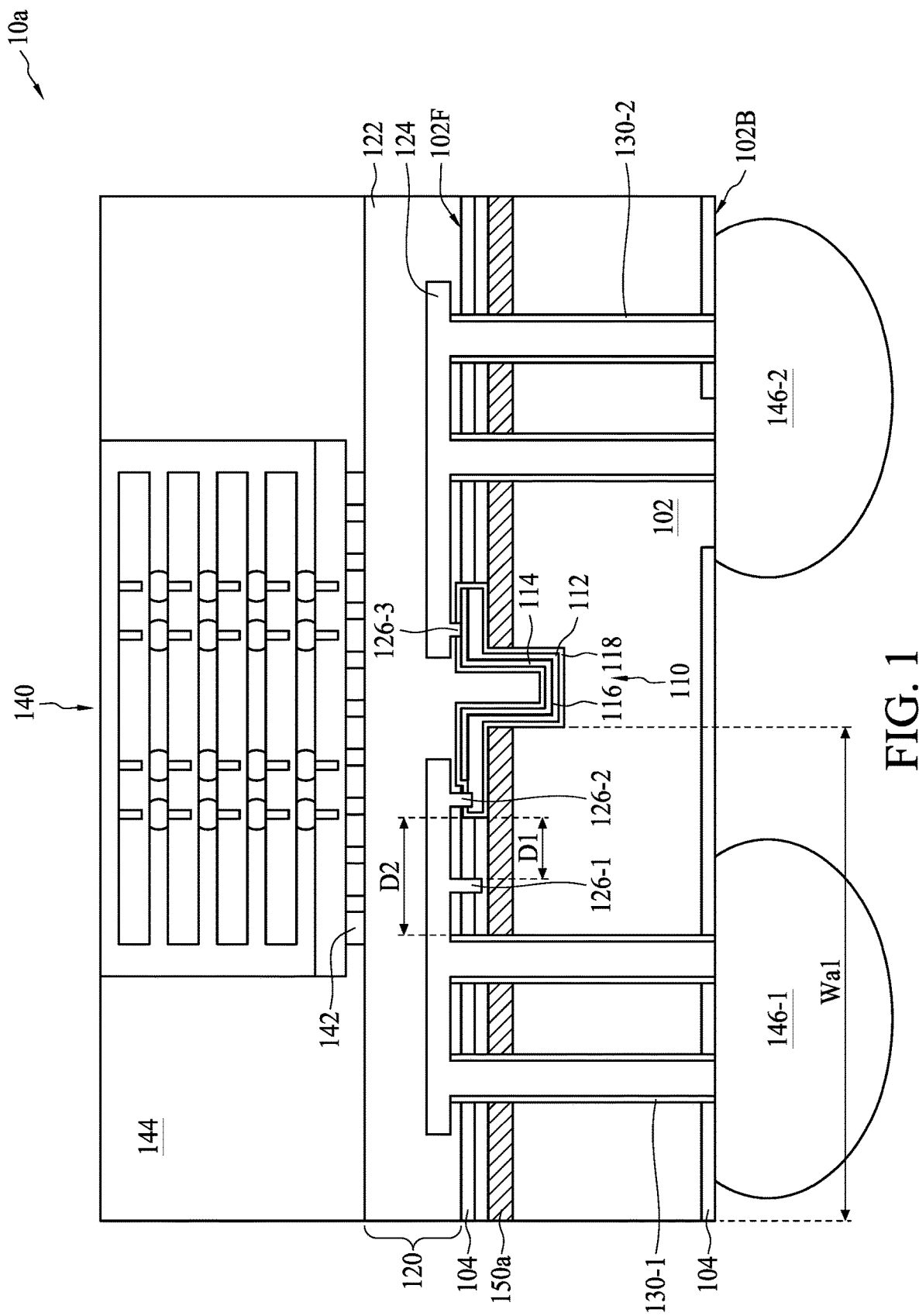
FIG. 1 shows a semiconductor package structure in accordance with some embodiments of the present disclosure.

The following disclosure provides many different embodiments, or examples, for implementing different features of the provided subject matter, Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, ray be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments will be described with respect to a specific context, namely wafer-level packaging comprising an interposer and a double-sided die bonded to the interposer. Other embodiments may also be applied, however, to other wafer-level packages with a package substrate or with dies bonded together without a package substrate or interposer.

In some embodiments, a capacitor is integrated in an interposer. In some embodiments, a metal-oxide-metal (MOM) capacitor may be integrated in the interposer. The MOM capacitor uses a silicon oxide layer as its dielectric, and thus may have a thinner insulating layer. Further, the MOM capacitor may occupy a smaller area for a given capacitance. In some embodiments, the MOM capacitor may be grounded through a through-silicon-via (TSV). However, it is found that the metal material used to form the MOM capacitor may smear around a VDD TSV. The metal residue may create a leakage path, which becomes an issue for the MOM capacitor integrated in the interposer.

The present disclosure therefore provides a semiconductor structure to mitigate the leakage issue. In some embodiments, at least a doped region is formed around a connecting structure, which is electrically connected to a substrate where a MOM capacitor is formed. The doped region serves as a barrier, such that the leakage path may be blocked. Consequently, the leakage issue is mitigated.

Figure 2:
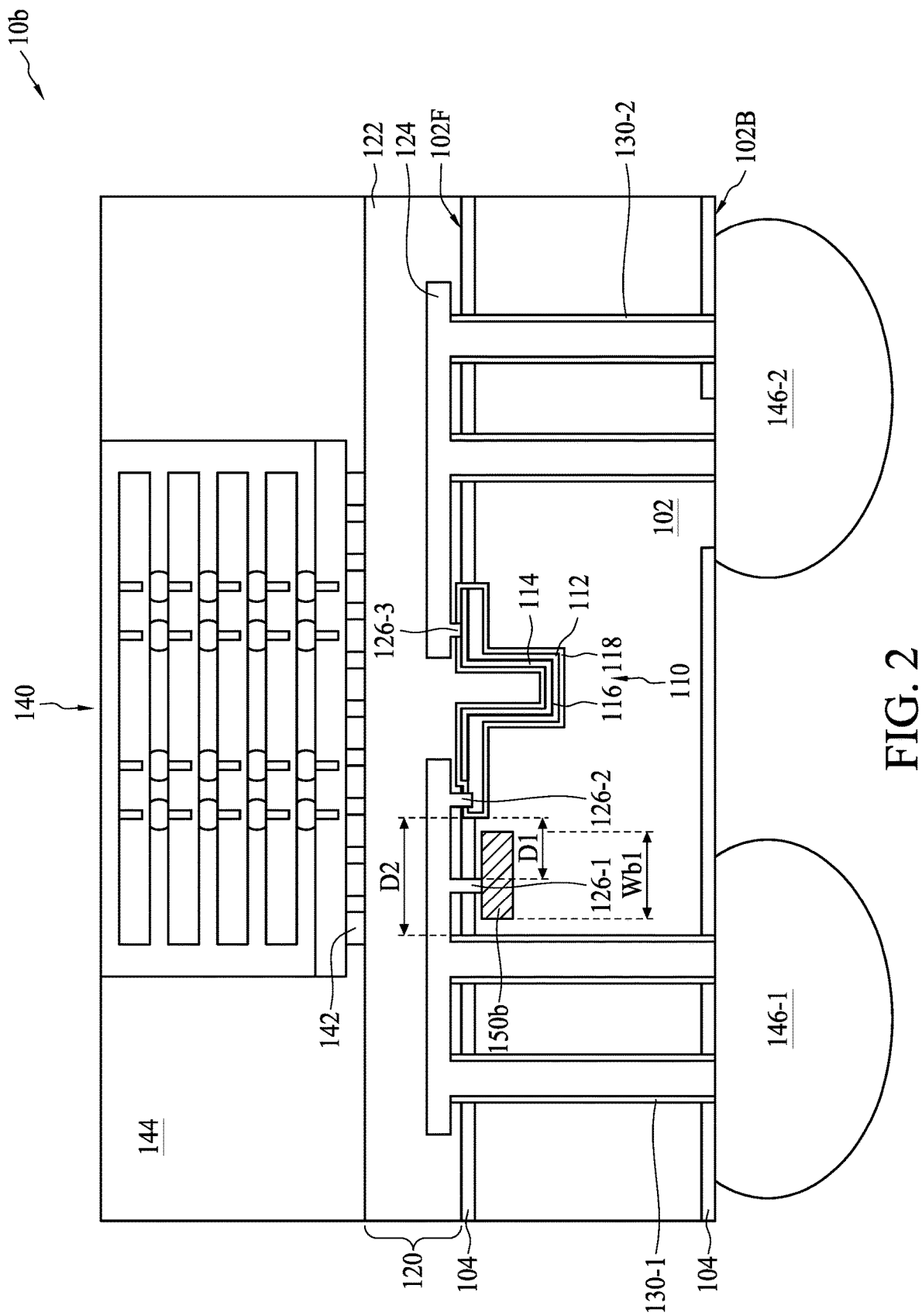
FIG. 2 shows a semiconductor package structure in accordance with some embodiments of the present disclosure.

Please refer to FIGS. 1 and 2, wherein FIG. 1 is a cross-sectional view of a semiconductor structure 10a and FIG. 2 is a cross-sectional view of a semiconductor structure 10b. It should be noted that same elements in FIGS. 1 and 2 are designated by same numerals, and may include same materials. In some embodiments, the semiconductor structures 10a and 10b may be semiconductor package structures. In some embodiments, FIGS. 1 and 2 are partial views of the semiconductor package structures 10a and 10b, which will be described below.

The semiconductor package structures 10a and 10b include a substrate 102. In some embodiments, the substrate 102 may be an interposer substrate. Further, the interposer substrate 102 may be a semiconductor interposer substrate, such as a silicon interposer substrate, doped or undoped, or an active layer of a silicon-on-insulator (SOI) substrate, used to provide support, but the disclosure is not limited thereto. The substrate 102 has a first surface 102F and a second surface 102B opposite to the first surface 102F. In some embodiments, the first surface 102F may be referred to as a front surface (i.e., an active surface), and the second surface 102B may be referred to as a back surface, but the disclosure is not limited thereto. In some embodiments, insulating layers 104 may be formed to cover portions of the first surface 102F and the second surface 102B, but the disclosure is not limited thereto. The insulating layer 104 may include silicon nitride, but the disclosure is not limited thereto.

The interposer substrate 102 may include devices formed within the first surface 102F. A wide variety of active devices and passive devices such as transistors, capacitors, resistors, inductors and the like may be formed in the substrate 102 to generate desired structural and functional performance for the semiconductor package structures 10a and 10b, but the disclosure is not limited thereto. For example, a capacitor 110 is disposed in the substrate 102. The capacitor 110 includes a first electrode 112, a second electrode 114, and a dielectric layer 116 between the first electrode 112 and the second electrode 114. In some embodiments, an insulating layer 118, such as a silicon oxide liner, may surround the capacitor 110, as shown in FIGS. 1 and 2. In some embodiments, a portion of the capacitor 110 is disposed within the substrate 102. For example, a first portion 111 (shown in FIGS. 5 to 13) of the capacitor 110 is embedded in the substrate 102, and thus a top surface of the first portion 111 of the capacitor 110 is at a level between the first surface 102F and the second surface 102B, as show %n in FIGS. 1 and 2. A second portion 113 (shown in FIGS. 5 to 13) of the capacitor 110 is disposed over the substrate 102, for example, and covers a portion of the first surface 102F of the substrate 102. Further, a third portion 115 (shown in FIGS. 5 to 13) of the capacitor 110 couples the first portion 111 to the second portion 113.

The semiconductor package structures 10a and 10b may include an interconnect structure 120 disposed over the first surface 102F of the substrate 102. The interconnect structure 120 may include an insulating layer 122. In some embodiments, the insulating layer 122 may be a multi-layered structure, though not shown, A plurality of conductive lines 124 are formed in the insulating layer 122 and a plurality of via structures 126-1, 126-2 and 126-3 are disposed to couple to the conductive lines 124. In some embodiments, the via structure 126-1 is coupled to the substrate 102, while the via structures 126-2 and 126-3 are coupled to the capacitor 110. For example, the via structure 126-2 may be coupled to the first electrode 112 of the capacitor 110, and the via structure 126-3 may be coupled to the second electrode 114 of the capacitor 110, but the disclosure is not limited thereto. In such embodiments, each of the via structures 126-1 and 126-2 is coupled to one of the conductive lines 124, as shown in FIGS. 1 and 2. In other words, the via structures 126-1 and 126-2 are electrically connected to each other through the conductive line 124.

The semiconductor package structures 10a and 10b further includes a plurality of through via (TV) structures 130-1 and 130-2. In some embodiments, the TV structures 130-1 and 130-2 penetrate the substrate 102 from the first surface 102F to the second surface 102B. Further, the TV structures 130-1 and 130-2 are respectively coupled to the conductive lines 124. As shown in FIGS. 1 and 2, the TV structure 130-1 is electrically connected to the capacitor 110 (i.e., the first electrode 112 of the capacitor 110) through the via structures 126-1 and 126-2 and the conductive line 124, while the TV structure 130-2 is electrically connected to the capacitor 110 (i.e., the second electrode 114 of the capacitor 110) through the via structure 126-3 and the conductive line 124. Further, the TV structure 130-1 and the TV structure 130-2 are separated from each other, as shown in FIGS. 1 and 2.

In some embodiments, a package 140 may be disposed over the first surface 102F of the substrate 102. Further, the package 140 is electrically connected to the interconnect structure 120. The package 140 may be a high bandwidth memory (IBM) package, a system-on-chip (SoC) package or the like. In some embodiments, the package 140 may further incorporate other chips, dies, packages, or electronic circuitry depending on the intended use or performance needs of the semiconductor package structures 10a and 10b. The package 140 may be electrically connected to the substrate 102 through connectors 142. The connectors 142 may be balls, bumps, columns, pillars or other structures formed from a conductive material, such as solder, metal, or metal alloy to facilitate electrical connections between the package 140 and the interconnect structure 120. A molding compound 144 may be disposed around the package 140 and the connectors 142. In some embodiments, a top surface of the molding compound 144 is aligned with (i.e., coplanar with) a top surface of the package 140, but the disclosure is not limited thereto.

In some embodiments, a plurality of conductors 146-1 and 146-2 are disposed over the second surface 102B of the substrate 102. The conductors 146-1 and 146-2 may include conductive materials such as solder balls, but the disclosure is not limited thereto. Further, a width of the conductors 146-1 and 146-2 is greater than a width of the connectors 142. In some embodiments, the conductors 146-1 and 146-2 may include controlled collapse chip connection (C4) bumps, but the disclosure is not limited thereto. The conductor 146-1 is separated from the conductor 146-2. A distance between the conductor 146-1 and the conductor 146-2 is greater than a distance between the connectors 142. In some embodiments, the conductor 146-1 may be coupled to the conductive line 124 through the TV structure 130-1. Thus, the conductor 146-1 is electrically connected to the capacitor 110 (i.e., the first electrode 112 of the capacitor 110) through the TV structure 130-1, the conductive line 124 and the via structure 126-2. The conductor 146-2 may be coupled to another conductive line 124 through the TV structure 130-2. Thus, the conductor 146-2 is electrically connected to the capacitor 110 (i.e., the second electrode 114 of the capacitor 110) through the TV structure 130-2, the conductive line 124 and the via structure 126-3.

In some embodiments, the conductor 146-1 is electrically connected to Vss, while the conductor 146-2 is electrically connected to Vdd, but the disclosure is not limited thereto. In some embodiments, the conductor 146-1 is separated from the substrate 102 by the insulating layer 104. However in some other embodiments, the conductor 146-2 may be accidentally in contact with the substrate 102, as shown in FIGS. 1 and 2.

Referring to FIG. 1, the semiconductor package structure 10a includes a doped region 150a, which serves as a barrier structure, in the substrate 102 and under the via structure 126-1. In other words, the semiconductor package structure 10a includes the barrier structure, which includes the doped region 150a. In some embodiments, the doped region 150a include p-type dopants. Alternatively, the doped region 150a includes n-type dopants. A concentration of the p-type dopants or the n-type dopants is between approximately $10^{12}$ $cm^{-3}$ and approximately $10^{16}$ $cm^{-3}$, but the disclosure is not limited thereto. A thickness of the doped region 150a may be between 2 micrometers and 5 micrometers, but the disclosure is not limited thereto. In some embodiments, a top surface of the doped region 150a is in contact with a bottom of the via structure 126-1, as shown in FIG. 1. In some embodiments, the bottom of the via structure 126-1 and a portion of sidewalls of the via structure 126-1 are in contact with the doped region 150a. In such embodiments, the bottom of the via structure 126-1 is separated from the substrate 102 by the doped region 150a. However, in other embodiments, the top surface of the doped region 150a may be separated from the bottom of the via structure 126-1. In some embodiments, the doped region 150a may be referred to as a deep n-well or a deep p-well. In such embodiments, a width Wa1 of the doped region 150a is greater than a distance D between a sidewall of the capacitor 110 and a sidewall the via structure 126-1. In some embodiments, the width Wa1 of the doped region 150a may be greater than a distance D2 between the sidewall of the capacitor 110 and a sidewall of the TV structure 130-1. In such embodiments, the doped region 150a, as a deep n-well or deep p-well, may surround the capacitor 110, the TV structure 130-1, and even the TV structure 130-2, as shown in FIG. 1, but the disclosure is not limited thereto.

Referring to FIG. 2, the semiconductor package structure 10b includes a doped region 150b directly under the via structure 126-1. Parameters (i.e., a concentration and a thickness) of the doped region 150b may be similar to that of the doped region 150a, except a width Wb1 of the doped region 150b is less than the width Wa1 of the doped region 150a. In contrast with the doped region 150a, which may be referred to as a well region, the doped region 150b is referred to as a localized doped region or an island-like region. As shown in FIG. 2, the width Wb1 of the doped region 150b is less than the distance between the sidewall of the capacitor 110 and the sidewall of the TV structure 130-1. Similar to the doped region 150a described above, a bottom of the via structure 126-1 may be in contact with or separated from the doped region 150b.

Still referring to FIGS. 1 and 2, in some embodiments, when the conductor 146-2 is in contact with the substrate 102, a leakage path may be formed from the conductor 146-2 to the via structure 126-1, The barrier structure (i.e., the doped region 150a of the semiconductor package structure 10a, or the doped region 150b of the semiconductor package structure 10b) helps to obstruct a leakage current. Accordingly, the leakage issue is mitigated by the doped regions 150a and 150b.

Figure 3:
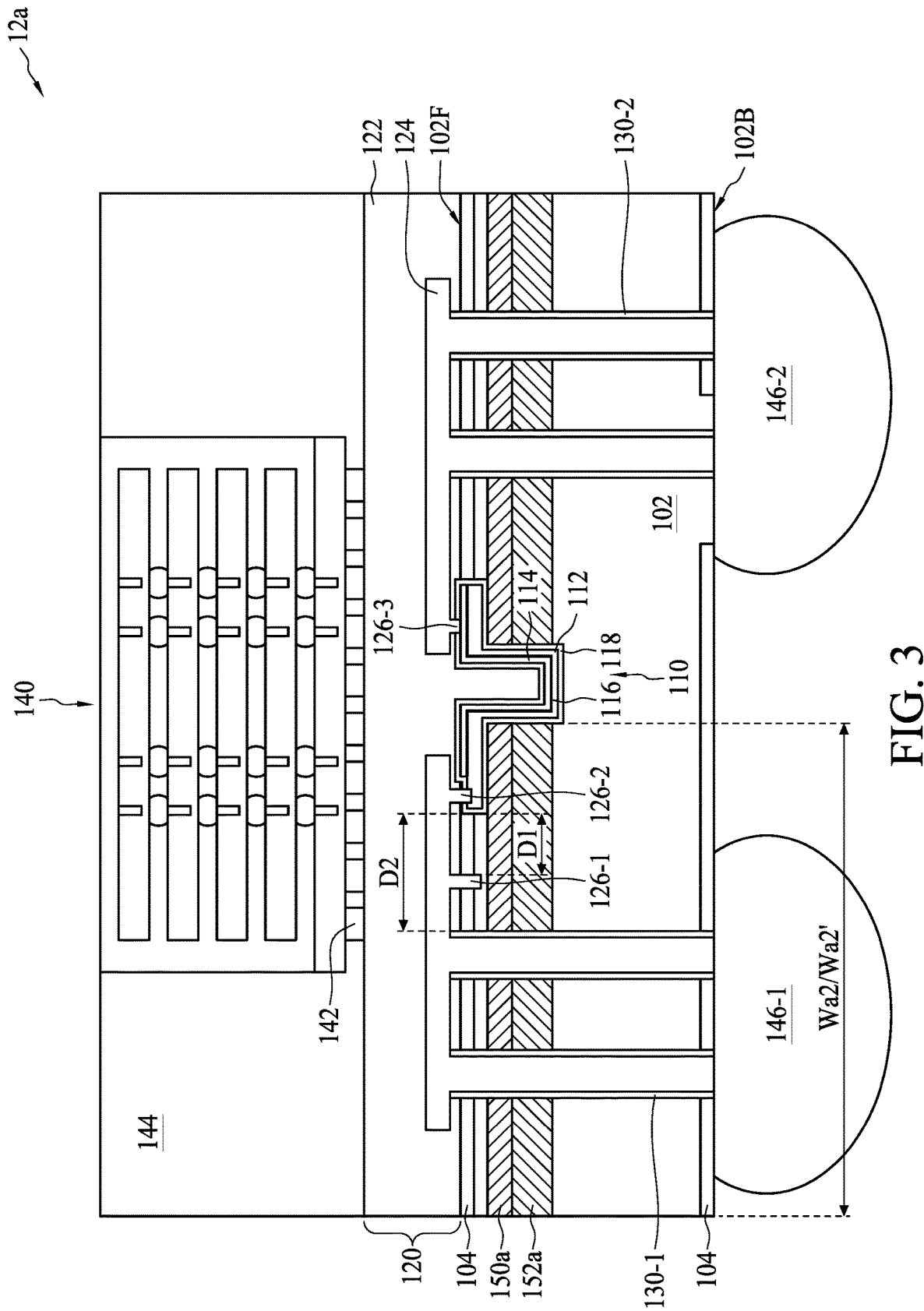
FIG. 3 shows a semiconductor package structure in accordance with some embodiments of the present disclosure.
Figure 4:
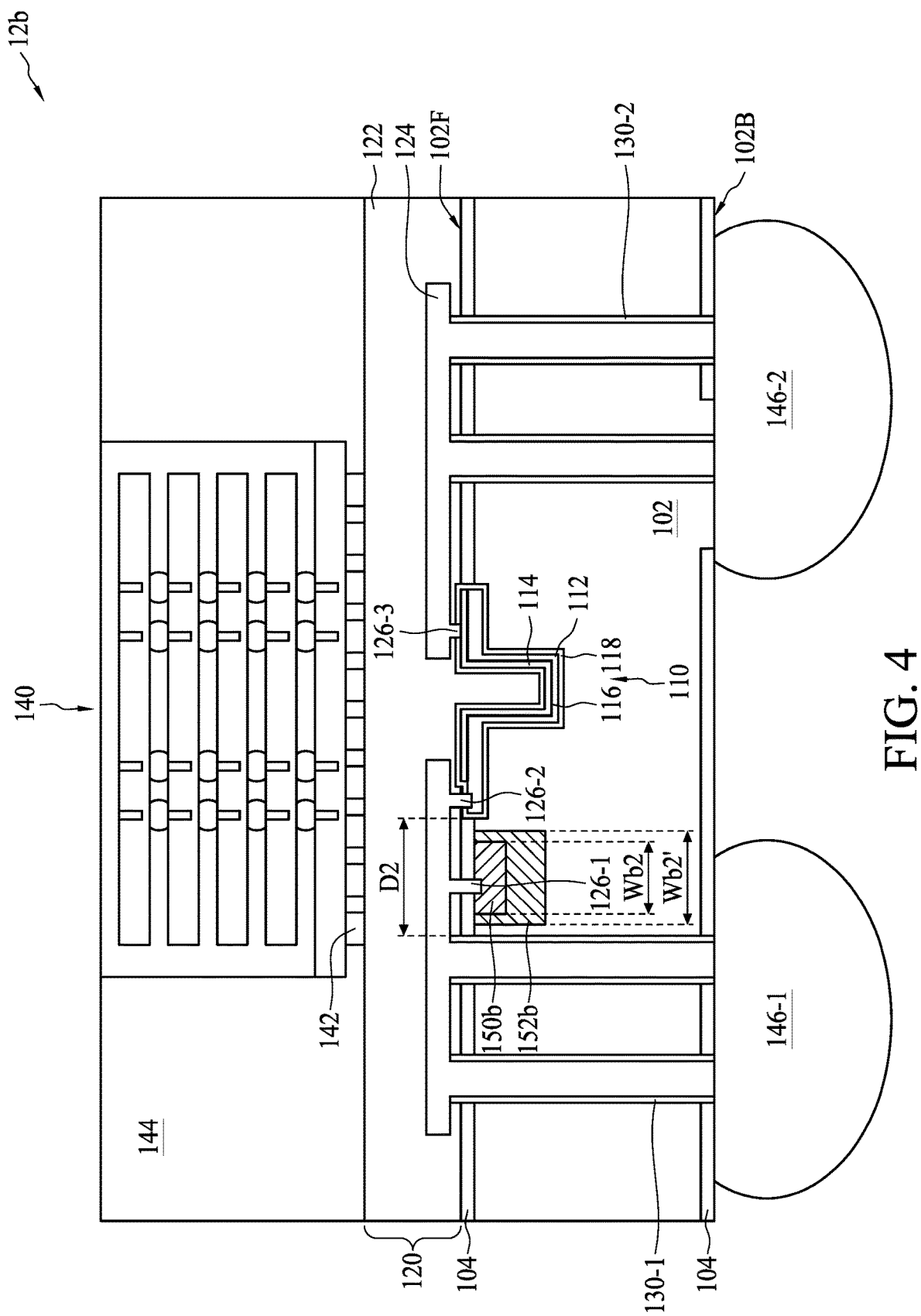
FIG. 4 shows a semiconductor package structure in accordance with some embodiments of the present disclosure.

Please refer to FIGS. 3 and 4, wherein FIG. 3 is a cross-sectional view of a semiconductor structure 12a and FIG. 4 is a cross-sectional view of a semiconductor structure 12b. It should be noted that same elements in FIGS. 1 to 4 are designated by same numerals, and may include same materials. In some embodiments, the semiconductor structures 12a and 12b respectively may be semiconductor package structures. In some embodiments, FIGS. 3 and 4 respectively are partial views of the semiconductor package structures 12a and 12b, which will be described below.

Each of the semiconductor package structures 12a and 12b includes a substrate 102. In some embodiments, the substrate 102 may be an interposer substrate. Further, the interposer substrate 102 may be a semiconductor interposer substrate, such as a silicon interposer substrate. The substrate 102 has a first surface 102F and a second surface 102B opposite to the first surface 102F. In some embodiments, insulating layers 104 may be formed to cover portions of the first surface 102F and the second surface 102B, but the disclosure is not limited thereto.

As mentioned above, the interposer substrate 102 may include devices formed within. For example, a capacitor 110 is disposed in the substrate 102. Details of the capacitor 110 may be similar to those described above; therefore, such details are omitted for brevity. The semiconductor package structures 12a and 12b may include an interconnect structure 120 disposed over the first surface 102F of the substrate 102. The interconnect structure 120 may include an insulating layer 122. A plurality of conductive lines 124 are formed in the insulating layer 122 and a plurality of via structures 126-1, 126-2 and 126-3 are disposed to couple to the conductive lines 124. Details of the interconnect structure 120 (i.e., the conductive lines 124 and the via structures 126-1 to 126-3) may be similar to those described above; therefore, such details are omitted for brevity. The semiconductor package structures 12a and 12b further includes a plurality of TV structures 130-1 and 130-2. Details of the TV structures 130-1 and 130-2 may be similar to those described above; therefore, such details are omitted for brevity.

In some embodiments, a package 140 may be disposed over the first surface 102F of the substrate 102. Further, the package 140 is electrically connected to the interconnect structure 120 through connectors 142. A molding compound 144 may be disposed around the package 140 and the connectors 142. Details of the package 140, the connectors 142 and the molding compound 144 may be similar as those described above; therefore, those details are omitted for brevity. In some embodiments, a plurality of conductors 146-1 and 146-2 are disposed over the second surface 102B of the substrate 102. Details of the conductors 146-1 and 146-2 may be similar as those described above; therefore, those details are omitted for brevity.

As mentioned above, in some embodiments, the conductor 146-1 is electrically connected to Vss, while the conductor 146-2 is electrically connected to Vdd, but the disclosure is not limited thereto. In some embodiments, the conductor 146-1 is separated from the substrate 102 by the insulating layer 104. However, in some other embodiments, the conductor 146-2 may be accidentally in contact with the substrate 102, as shown in FIGS. 3 and 4.

Referring to FIG. 3, the semiconductor package structure 12a includes a doped region 150a and a doped region 152a under the doped region 150a in the substrate 102 and under the via structure 126-1. In some embodiments, the doped region 150a is separated from the doped region 152a. In some alternative embodiments, the dope region 150a is in contact with the doped region 152a, as shown in FIG. 3. Both the doped regions 150a and 152a serve as barrier structures. In other words, the semiconductor package structure 12a includes a barrier structure, which includes two doped regions 150a and 152a. The doped regions 150a and 152a include dopants of a same type. For example, in some embodiments, both the doped regions 150a and 152a include p-type dopants. Alternatively, both the doped regions 150a and 152a include n-type dopants. Concentrations of p-type dopants or n-type dopants in the doped regions 150a and 152a may be similar. Alternatively, the concentration of the dopants in the doped region 150a is different from that in the doped region 152a. For example, the concentrations of the dopants in the doped regions 150a is greater than the concentration of the dopants in the doped region 152a. The thicknesses of the doped regions 150a and 152a may be similar to those described above; therefore, such details are omitted for brevity. In some embodiments, a top surface of the doped region 150a is in contact with a bottom of the via structure 126-1, as shown in FIG. 3. In some embodiments, the bottom of the via structure 126-1 and a portion of sidewalls of the via structure 126-1 are in contact with the doped region 150a. In such embodiments, the bottom of the via structure 126-1 is separated from the substrate 102 and the doped region 152a by the doped region 150a. In other embodiments, the top surface of the doped region 152a may be separated from the bottom of the via structure 126-1.

In some embodiments, the doped regions 150a and 152a may be referred to as deep n-wells or deep p-wells. In such embodiments, a width Wa2 of the doped region 150a and a width Wa2' of the doped region 152a are greater than a distance D1 between a sidewall of the capacitor 110 and a sidewall the via structure 126-1. In some embodiments, the width Wa2 of the doped region 150a and the width Wa2' of the doped region 152a may be greater than a distance D2 between the sidewall of the capacitor 110 and a sidewall of the TV structure 130-1. In such embodiments, the doped regions 150a and 152a, as a deep n-well or p-well, may surround the capacitor 110, the TV structure 130-1, and even the TV structure 130-2, as shown in FIG. 3, but the disclosure is not limited thereto.

Additionally, the width Wa2 of the doped region 150a may be similar to the width Wa2' of the doped region 152a, as shown in FIG. 3. In other embodiments, the width Wa2 of the doped region 150a may be different from the width Wa2' of the doped region 152a, depending on various product requirements.

Referring to FIG. 4, the semiconductor package structure 12b includes doped regions 150b and 152b directly under a via structure 126-1. Parameters of the doped regions 150b and 152b may be similar to parameters of the doped regions 150a and 152a of the semiconductor package structure 12a, except a width Wb2 of the doped region 150b and a width Wb2' of the doped region 152b are less than the width Wa2 of the doped region 150a and the width Wa2' of the doped region 152a. In contrast with the doped regions 150a and 152a, which may be referred to as well regions, the doped regions 150b and 152b are referred to as localized doped regions or island-like regions. As shown in FIG. 4, the width Wb2 of the doped region 150b and the width Wb2 of the doped region 152b are less than a distance D2 between a sidewall of the capacitor 110 and a sidewall of the TV structure 130-1. Further, the width Wb2' of the doped region 152b is greater than the width Wb2 of the doped region 150b. In some embodiments, the doped region 152b surrounds the doped region 150b, but the disclosure is not limited thereto. Similar to the semiconductor package structure 12a, in the semiconductor package structure 12b, a bottom of the via, structure 126-1 may be in contact with or separated from the doped region 150b.

Still referring to FIGS. 3 and 4, in some embodiments, when the conductor 146-2 is in contact with the substrate 102, a leakage path may be formed from the conductor 146-2 to the via structure 126-1. The barrier structure (i.e., the doped regions 150a and 152a of the semiconductor package structure 12a, and the doped regions 150b and 152b of the semiconductor package structure 12b) helps to obstruct a leakage current. Accordingly, the leakage issue is mitigated by the doped regions 150a, 152a and 150b, 152b.

Figure 5:
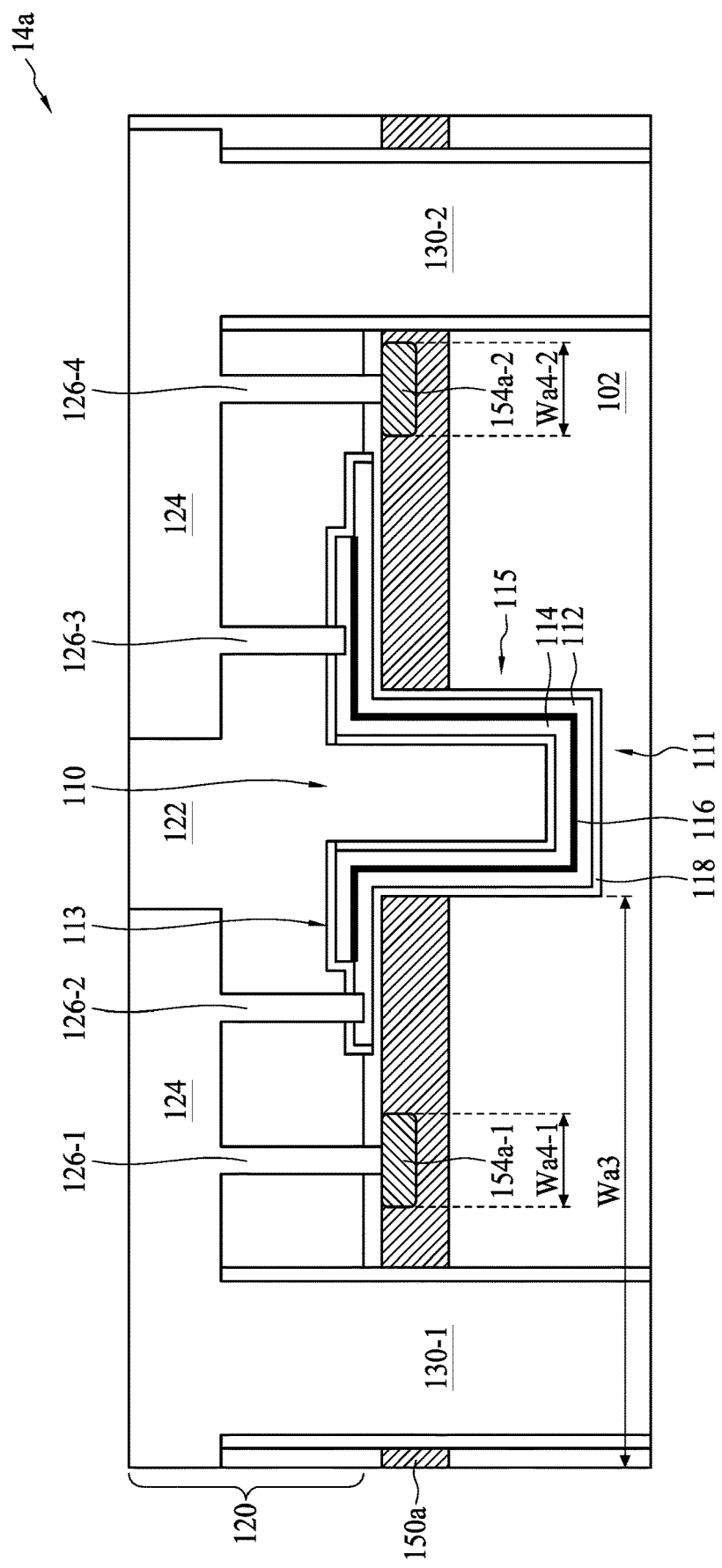
FIG. 5 shows a semiconductor package structure in accordance with some embodiments of the present disclosure.
Figure 6:
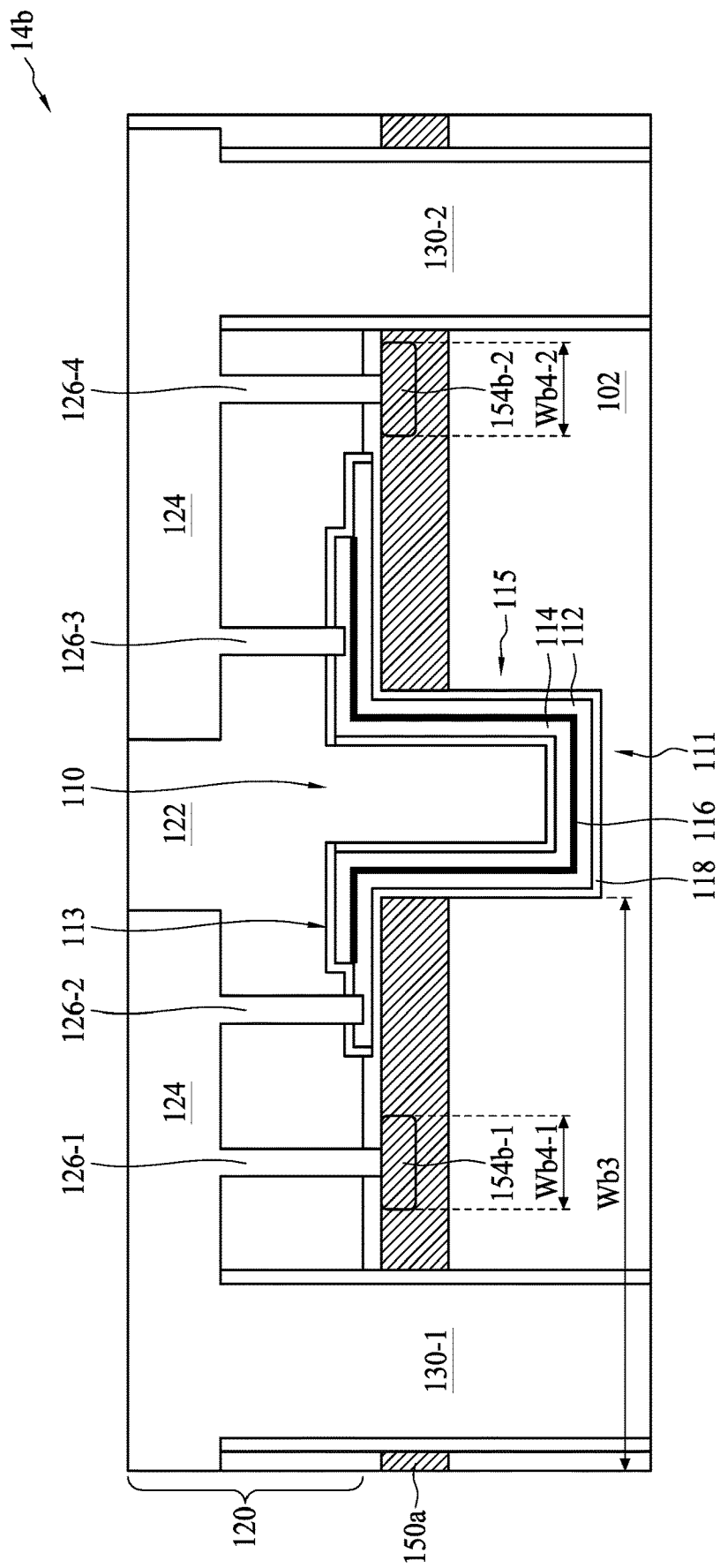
FIG. 6 shows a semiconductor package structure in accordance with some embodiments of the present disclosure.
Figure 7:
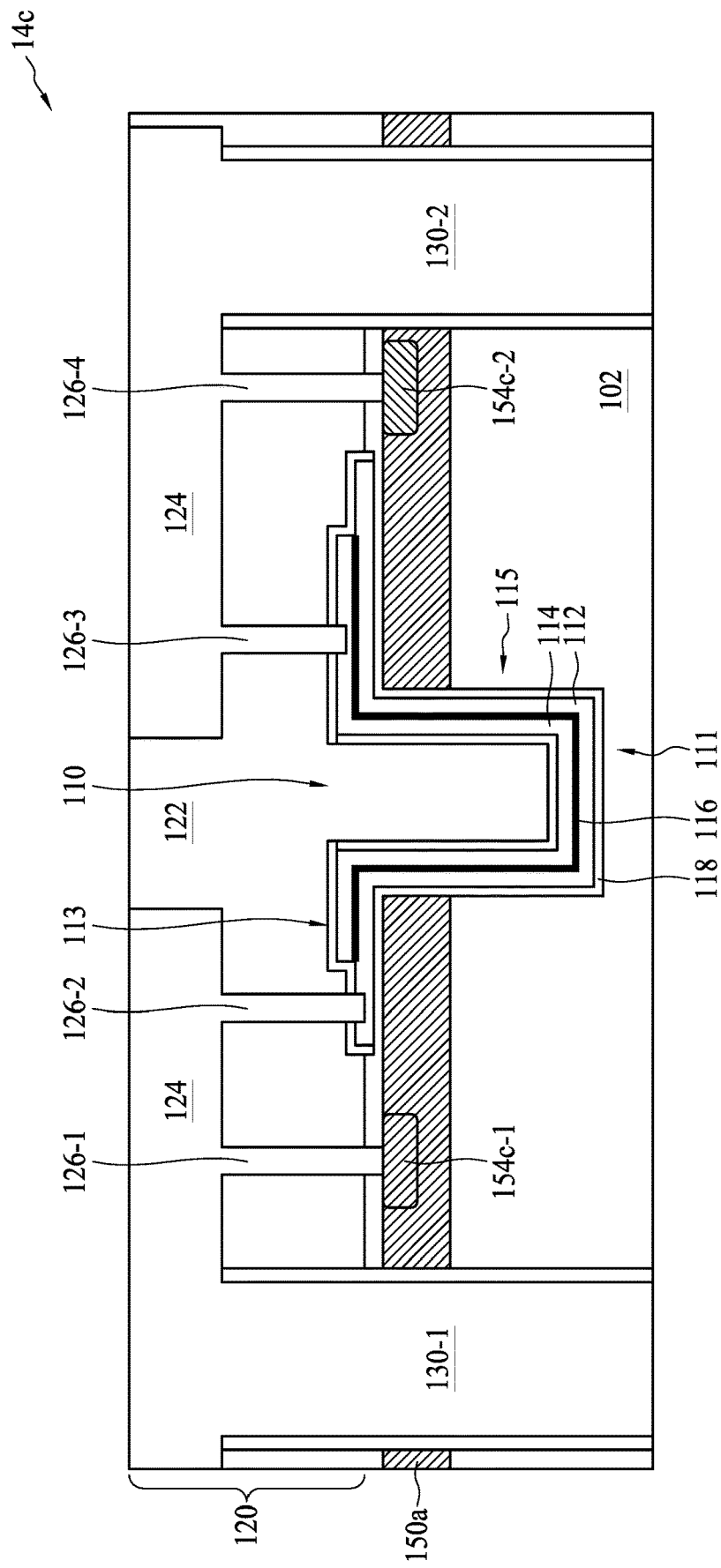
FIG. 7 shows a semiconductor package structure in accordance with some embodiments of the present disclosure.
Figure 8:
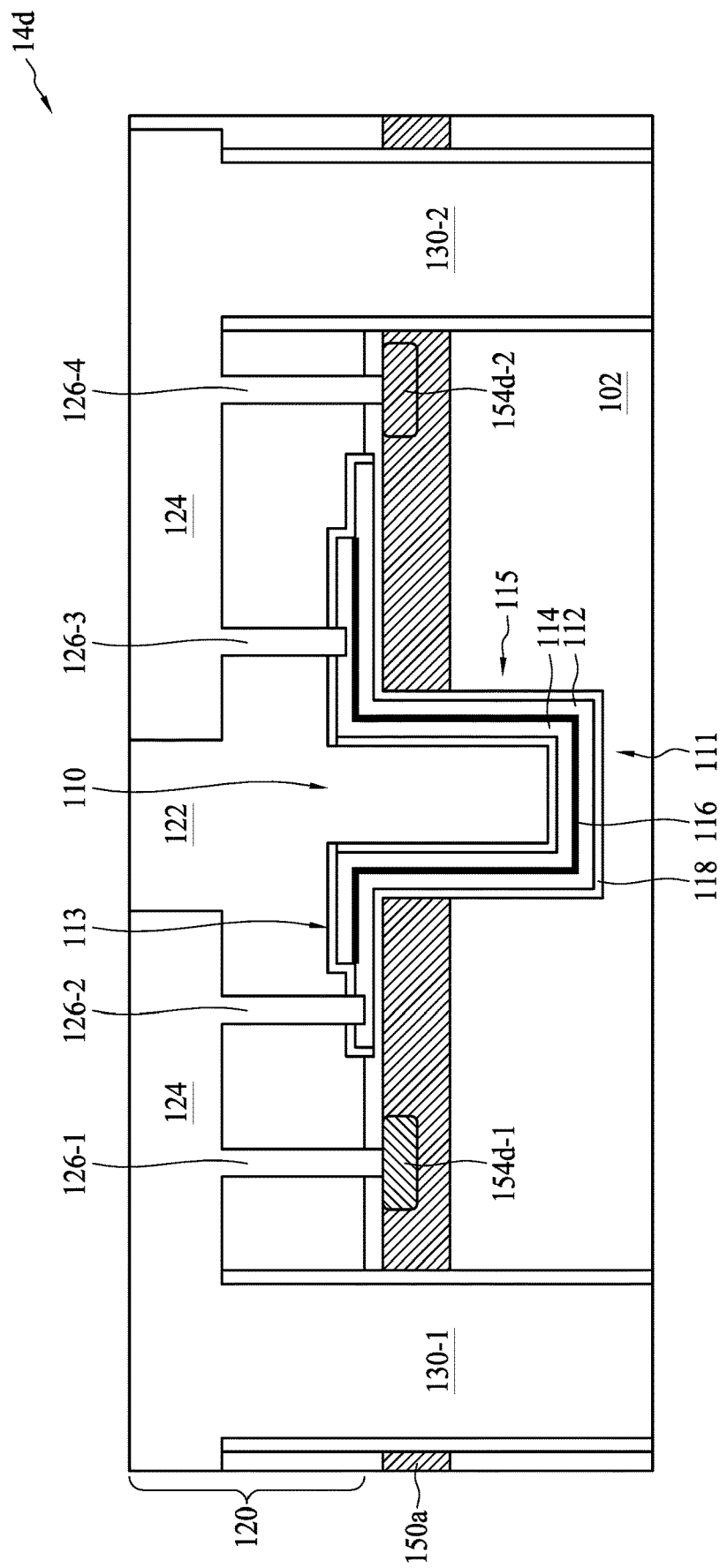
FIG. 8 shows a semiconductor package structure in accordance with some embodiments of the present disclosure.

Please refer to FIGS. 5 to 8, wherein FIG. 5 is a cross-sectional view of a semiconductor structure 14a, FIG. 6 is a cross-sectional view of a semiconductor structure 14b, FIG. 7 is a cross-sectional view of a semiconductor structure 14c, and FIG. 8 is a cross-sectional view of a semiconductor structure 14d. It should be noted that same elements in FIGS. 1 to 8 are designated by same numerals, and may include same materials. Further, elements, such as a package 140, connectors 142, a molding compound 144 and TV structures 130-1 and 130-2 are similar to those described above; therefore such details are omitted from FIGS. 5 to 8.

Similar to the structures described above, the semiconductor package structures 14a to 14d include a via structure 126-1 coupling a conductive line 124 to a substrate 102, a via structure 126-2 coupling a first electrode 112 of a capacitor 110 to the conductive line 124, and a via structure 126-3 coupling a second electrode 114 of the capacitor 110 to another conductive line 124. In some embodiments, the semiconductor package structures 14a to 14d further include a via structure 126-4 coupling the conductive line 124 to the substrate 102, as shown in FIGS. 5 to 8.

In some embodiments, as shown in FIG. 5, the semiconductor package structure 14a includes a doped region 150a in the substrate 102 and doped regions 154a-1 and 154a-2 over the doped region 150a. The doped region 150a serves as a deep well, and may surround the capacitor 110 and the TV structures 130-1 and 130-2. The doped region 154a-1 is disposed between the doped region 150a and the via structure 126-1. Further, the doped region 154a-1 may be in contact with the via structure 126-1. The doped region 154a-2 is disposed between the doped region 150a and the via structure 126-4. Further, the doped region 154a-2 may be in contact with the via structure 126-4. However, the doped region 154a-1 may be separated from the via structure 126-1, and the doped region 154a-2 may be separated from the via structure 126-4, though not shown. The doped region 150a surrounds the doped regions 154a-1 and 154a-2. In other words, the doped regions 154a-1 and 154a-2 are in contact with the doped region 150a, but the disclosure is not limited thereto.

Additionally, in other embodiments, the doped region 154a-1 may be separated from the doped region 150a, and the doped region 154a-2 may be separated from the doped region 150a, though not shown.

In contrast with the doped region 150a, the doped regions 154a-1 and 154a-2 are localized regions or island-like regions, as shown in FIG. 5. In other words, a width Wa4-1 of the doped region 154a-1 and a width Wa4-2 of the doped region 154a-2 are both less than a width Wa3 of the doped region 150a. Additionally, the width Wa4-1 of the doped region 154a-1 and the width Wa4-2 of the doped region 154a-2 may be similar to each other, as shown in FIG. 5, but the disclosure is not limited thereto.

Referring to FIG. 5, the doped region 150a and the doped regions 154a-1 and 154a-2 include dopants of complementary types. For example, when the doped region 150a includes n-type dopants, the doped regions 154a-1 and 154a-2 include p-type dopants. In some alternative embodiments, when the doped region 150a includes p-type dopants, the doped regions 154a-1 and 154a-2 include n-type dopants. Further, concentrations of the dopants in the doped regions 154a-1 and 154a-2 are both greater than a concentration of the dopants in the doped region 150a. Additionally, the concentration of the dopants in the doped region 154a-1 and the concentration of the dopants in the doped region 154a-2 may be similar, but the disclosure is not limited thereto.

Referring to FIG. 6, in some embodiments, the semiconductor package structure 14b includes a doped region 150a in the substrate 102, and doped regions 154b-1 and 154b-2 over the doped region 150a. As mentioned above, the doped region 150a serves as a deep well, and may surround the capacitor 110 and the TV structures 130-1 and 130-2. The doped region 154b-1 is disposed between the doped region 150a and the via structure 126-1. Further, the doped region 154b-1 may be in contact with the via structure 126-1. The doped region 154b-2 is disposed between the doped region 150a and the via structure 126-4. Further, the doped region 154b-2 may be in contact with the via structure 126-4. However, the doped region 154b-1 may be separated from the via structure 126-1, and the doped region 154b-2 may be separated from the via structure 126-4, though not shown. The doped regions 154b-1 and 154b-2 may be in contact with the doped region 150a, but the disclosure is not limited thereto.

The doped region 150a is a deep well region, while the doped regions 154b-1 and 154b-2 are localized regions or island-like regions, as shown in FIG. 6. In other words, a width Wb4-1 of the doped region 154b-1 and a width Wb4-2 of the doped region 154b-2 are both less than a width Wb3 of the doped region 150a. Additionally, the width Wb4-1 of the doped region 154b-1 and the width Wb4-2 of the doped region 154b-2 may be similar to each other, as shown in FIG. 6, but the disclosure is not limited thereto.

In some embodiments, the doped region 150a surrounds the doped regions 154b-1 and 154b-2. Thus, the doped regions 154b-1 and 154b-2 are in contact with the doped region 150a. In other embodiments, the doped regions 154b-1 and 154a-2 may be separated from the doped region 150a, though not shown.

Still referring to FIG. 6, the doped region 150a and the doped regions 154b-1 and 154b-2 include dopants of a same type. For example, the doped regions 150a, 154b-1 and 154b-2 may all include p-type dopants. Alternatively, the doped regions 150a, 154b-1 and 154b-2 may all include n-type dopants. Concentrations of the dopants in the doped regions 154b-1 and 154b-2 are both greater than a concentration of dopants in the doped region 150a. Additionally, the concentration of the dopants in the doped region 154a-1 and the concentration of the dopants in the doped region 154a-2 may be similar, but the disclosure is not limited thereto.

Referring to FIG. 7, in some embodiments, the semiconductor package structure 14c includes a doped region 150a in the substrate 102, and doped regions 154c-1 and 154c-2 over the doped region 150a. Parameters (i.e., widths and thicknesses) of the doped regions 150a, 154c-1 and 154c-2 may be similar to those described above; therefore, such details are omitted for brevity.

In some embodiments, the doped region 150a surrounds the doped regions 154c-1 and 154c-2. Thus, the doped regions 154c-1 and 154c-2 are in contact with the doped region 150a. In other embodiments, the doped regions 154c-1 and 154c-2 may be separated from the doped region 150a, though not shown.

In the semiconductor package structure 14c, the doped region 150a and the doped region 154c-1 may include dopants of a first conductivity type, while the doped region 154c-2 includes dopants of a second conductivity type complementary to the first conductivity type. For example, the doped regions 150a and 154c-1 may include n-type dopants, while the doped region 154c-2 include p-type dopants. Alternatively, the doped regions 150a and 154c-1 may include p-type dopants, while the doped region 154c-2 includes the n-type. Concentrations of the dopants in the doped regions 154c-1 and 154c-2 are both greater than a concentration of dopants in the doped region 150a.

Referring to FIG. 8, in some embodiments, the semiconductor package structure 14d includes a doped region 150a in the substrate 102, and doped regions 154d-1 and 154d-2 over the doped region 150a. Parameters (i.e., widths and thicknesses) of the doped regions 150a. 154d-1 and 154d-2 may be similar to those described above; therefore, such details are omitted for brevity.

In some embodiments, the doped region 150a surrounds the doped regions 154d-1 and 154d-2. Thus, the doped regions 154d-1 and 154d-2 are in contact with the doped region 150a. In other embodiments, the doped regions 154d-1 and 154d-2 may be separated from the doped region 150a, though not shown.

In the semiconductor package structure 14d, the doped region 150a and the doped region 154d-2 may include dopants of a first conductivity type, while the doped region 154d-1 includes dopants of a second conductivity type complementary to the first conductivity type. For example, the doped regions 150a and 154d-2 may include n-type dopants, while the doped region 154d-1 includes p-type dopants. Alternatively, the doped regions 150a and 154d-2 may include p-type dopants, while the doped region 154d-1 includes n-type dopants. Concentrations of the dopants in the doped regions 154d-1 and 154d-2 are both greater than a concentration of dopants in the doped region 150a.

Additionally, in some embodiments the semiconductor package structures 14a to 14d may include a doped region 150b disposed under the doped region 150a, similar to the configurations shown in FIGS. 3 and 4.

Referring to FIGS. 5 to 8, in some embodiments, when the conductor 146-2 is in contact with the substrate 102, a leakage path may be formed from the conductor 146-2 to the via structure 126-1. The doped regions of the semiconductor package structure 14a to 14d serve as a barrier structure, such that a leakage current may be obstructed by the barrier structure. Accordingly, the leakage issue is mitigated by the doped regions.

Figure 9:
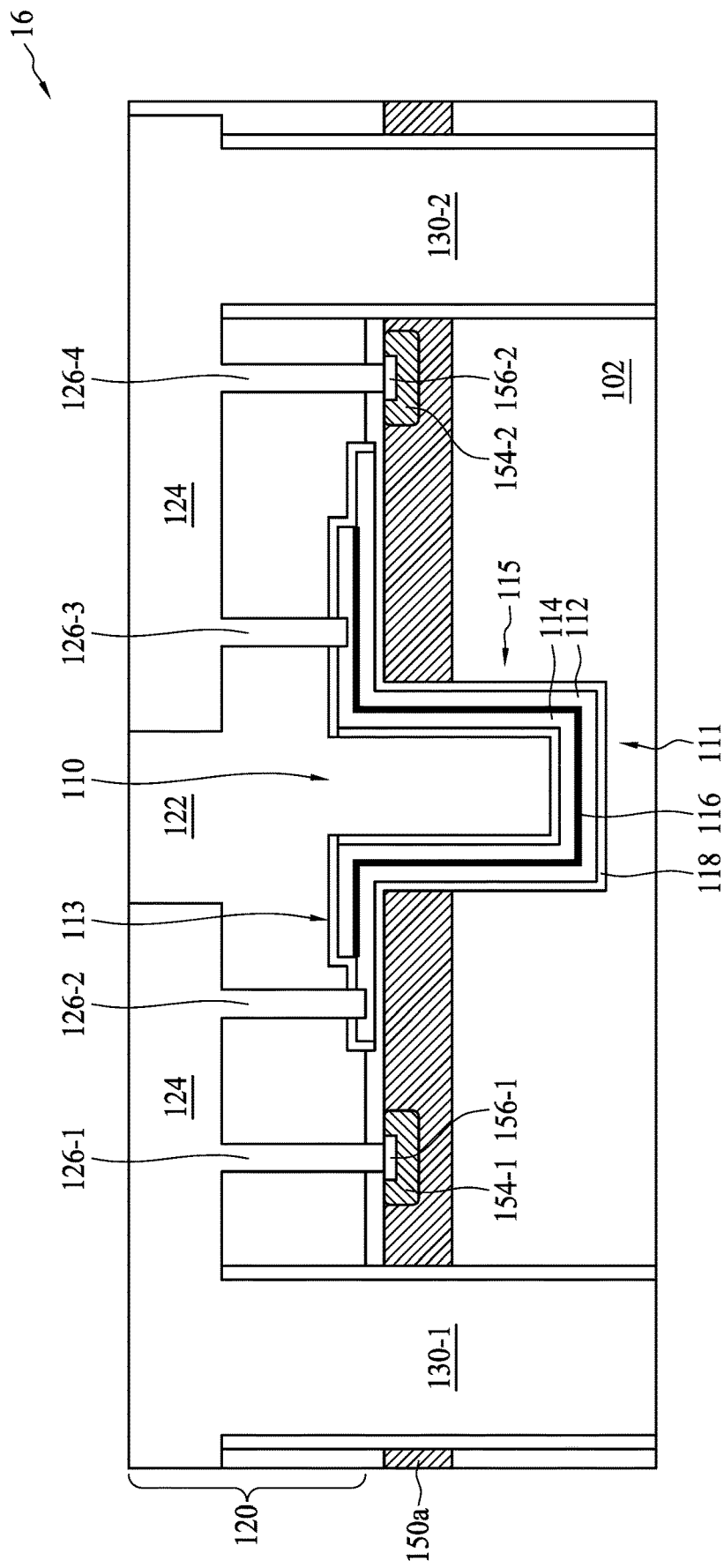
FIG. 9 shows a semiconductor package structure in accordance with some embodiments of the present disclosure.

Please refer to FIG. 9, wherein FIG. 9 is a cross-sectional view of a semiconductor structure 16. It should be rioted that same elements in FIGS. 1 to 9 are designated by same numerals, and may include same materials. Further, elements, such as the package 140, the connectors 142, the molding compound 144 and the conductors 146-1 and 146-2 are similar to those described above; therefore, such details are omitted from FIG. 9.

Similar to the semiconductor structures described above, the semiconductor package structure 16 includes a via structure 126-1 coupling the conductive line 124 to the substrate 102, a via structure 126-2 coupling the first electrode 112 of the capacitor 110 to the conductive line 124, a via structure 126-3 coupling the second electrode 114 of the capacitor 110 to another conductive line 124, and a via, structure 126-4 coupling the conductive line 124 to the substrate 102.

In some embodiments, the semiconductor package structure 16 includes a doped region 150a in the substrate 102, a doped region 156-1 between the doped region 150a and the via structure 126-1, and a doped region 154-1 between the doped region 150a and the doped region 156-1. Further, the semiconductor package structure 16 includes a doped region 156-2 between the doped region 150a and the via structure 126-4, and a doped region 154-2 between the doped region 150a and the doped region 156-2. The doped region 150a serves as a deep well, and may surround the capacitor 110 and the TV structures 130-1 and 130-2.

The doped region 156-1 may be in contact with the via structure 126-1, and the doped region 156-2 may be in contact with the via structure 126-4. The doped region 154-1 may surround the doped region 156-1, and separates the doped region 156-1 from the doped region 150a. Similarly, the doped region 154-2 may surround the doped region 156-2, and separates the doped region 156-2 from the doped region 150a.

In contrast with the doped region 150a, which is referred to as a deep well region, the doped regions 154-1 and 154-2 and the doped regions 156-1 and 156-2 are localized regions or island-like regions, as shown in FIG. 9. A width of the doped region 154-1 and a width of the doped region 154-2 are both less than a width of the doped region 150a. Additionally, the width of the doped region 154-1 and the width of the doped region 154-2 may be similar to each other, but the disclosure is not limited thereto. A width of the doped region 156-1 is less than the width of the doped region 154-1, and a width of the doped region 156-2 is less than the width of the doped region 154-2. Additionally, the width of the doped region 156-1 and the width of the doped region 156-2 may be similar to each other, but the disclosure is not limited thereto.

In some embodiments, the doped region 150a surrounds the doped regions 154-1 and 154-2. Thus, the doped regions 154-1 and 154-2 are in contact with the doped region 150a. In other embodiments, the doped regions 154-1 and 154-2 may be separated from the doped region 150a, though not shown.

In some embodiments, dopants of the doped region 150a, the doped regions 154-1 and 154-2 and the doped regions 156-1 and 156-2 may include various combinations. For example, the combination of the doped regions 150a, 154-1 and 156-1 may be n-p-n, n-p-p, n-n-p or n-n-n. In other embodiments, the combination of the doped regions 150a, 154-1 and 156-1 may be p-p-n, p-p-p, p-n-p or p-n-n. The combination of the doped regions 154-2 and 156-2 may be p-n, p-p, n-p or n-n, independent of the combination of the doped regions 150, 154-1 and 156-1. Concentrations of the dopants in the doped regions 156-1 and 156-2 are both greater than concentrations of the dopants in the doped regions 154-1 and 154-2. Further, the concentrations of the doped regions 154-1 and 154-2 are both greater than a concentration of the dopants in the doped region 150a.

Additionally, in some embodiments, the semiconductor package structure 16 may include a doped region 150b disposed under the doped region 150a, similar to the configurations shown in FIGS. 3 and 4.

Referring to FIG. 9, in some embodiments, when the conductor 146-2 is in contact with the substrate 102, a leakage path may be formed from the conductor 146-2 to the via structure 126-1. The doped regions of the semiconductor package structure 16 serve as a barrier structure, such that a leakage current may be obstructed by the barrier structure. Accordingly, leakage issue is mitigated by the doped regions.

Figure 10:
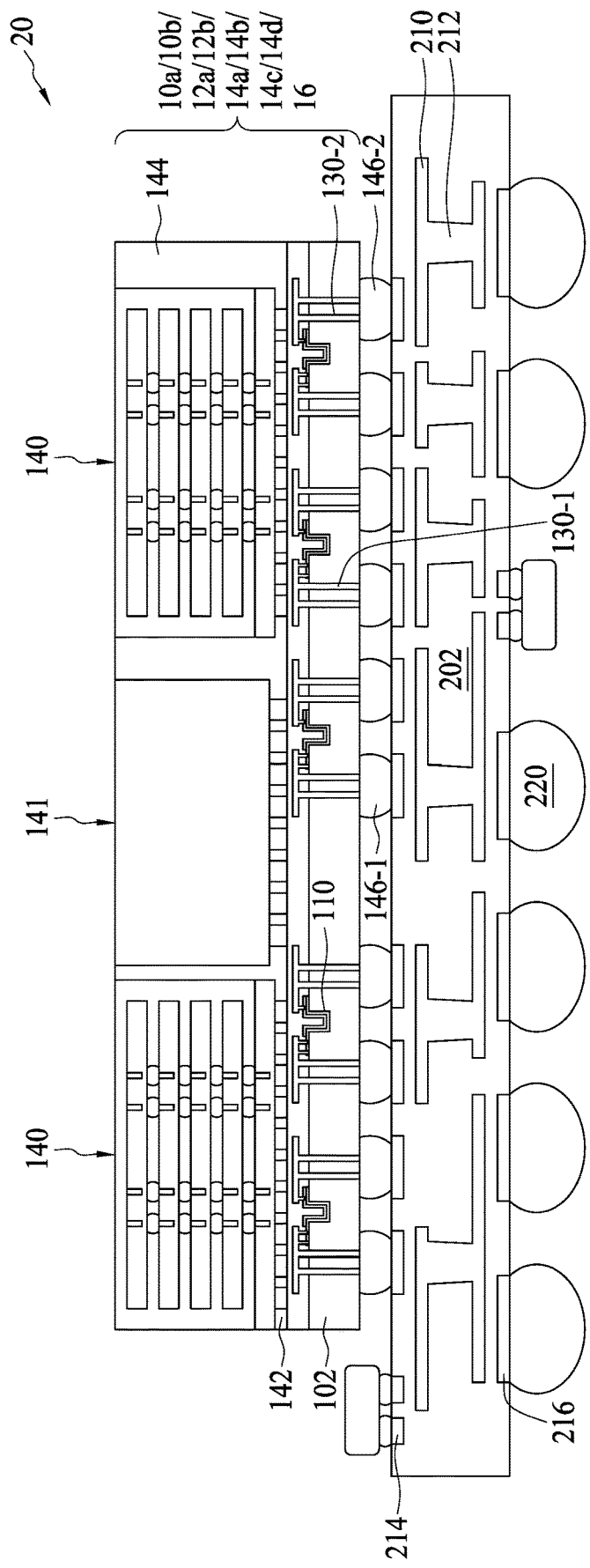
FIG. 10 shows a semiconductor package structure in accordance with some embodiments of the present disclosure.

Please refer to FIG. 10, which is a cross-sectional view of a semiconductor structure 20. It should be noted that same elements in FIGS. 1 and 10 are designated by same numerals, and may include same materials. In some embodiments, the semiconductor structure 20 may be include the semiconductor package structure 10a, 10b, 12a, 12b, 14a, 14b, 14c, 14d or 16. Therefore, details are omitted for brevity. In some embodiments, another package 141 may be disposed and connected to the substrate 102 through the connectors 142, as shown in FIG. 10, but the disclosure is not limited thereto. In such embodiments, the semiconductor package structure 10a, 10b, 12a, 12b, 14a, 14b, 14c, 14d or 16 may include not only a high bandwidth memory (HBM) package 140 but also other packages such as a system-on-chip (SoC) package 141, but the disclosure is not limited thereto.

In some embodiments, at least one of the abovementioned semiconductor package may be disposed over a substrate 202. A plurality of conductive lines 210 are disposed in the substrate 202 and connected to each other through via structures 212. The semiconductor structure 20 further includes a plurality of bonding pads 214 and 216 disposed at two opposite surfaces of the substrate 202. In some embodiments, conductors 146-1 and 146-2 of the semiconductor package structure 10a, 10b, 12a, 12b, 14a, 14b, 14c, 14d, or 16 are bonded to the pads 214, such that the semiconductor package structure 10a, 10b, 12a, 12b, 14a, 14b, 14c, 14d, or 16 is electrically connected to the substrate 202 through the conductors 146 and the pads 214. A plurality of conductors 220 are disposed over the pads 216 for external connections.

As described above, when the conductor 146-2 is in contact with the substrate 102, a leakage path may be formed from the conductor 146-2 to the via structure 126-1. The doped regions of the semiconductor package structure 20 serve as a barrier structure, such that a leakage current may be obstructed by the barrier structure. Accordingly, leakage issue is mitigated by the doped regions.

Figure 11:
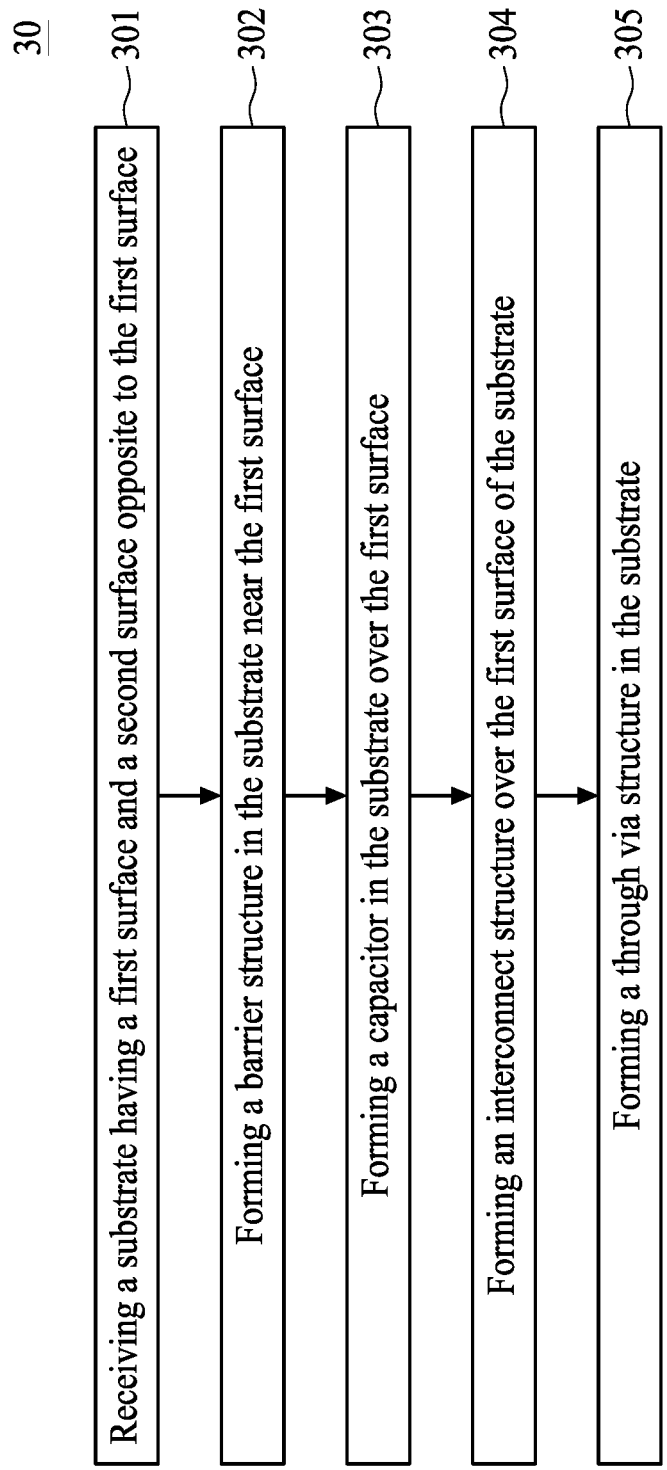
FIG. 11 shows a flowchart representing a method for forming a semiconductor package structure in accordance with some embodiments of the present disclosure.

Please refer to FIG. 11, which shows a flowchart representing a method 30 for forming a semiconductor package structure in accordance with some embodiments of the present disclosure. In some embodiments, a semiconductor structure 10a, 10b, 12a, 12b, 14a, 14b, 14c, 14d, or 16 is formed by the method 30. The method 30 includes a number of operations (301, 302 and 303) and the description and illustration are not deemed as a limitation to the sequence of the operations. The method 30 will be further described according to one or more embodiments. It should be noted that the operations of the method 30 may be rearranged or otherwise modified within the scope of the various aspects. It should be further noted that additional processes may be provided before, during, and after the method 30, and that some other processes may be only briefly described herein Thus, other implementations are possible within the scope of the various aspects described herein.

Please refer to FIGS. 12 to 15E, which are schematic drawings of a semiconductor package structure in various stages according to aspects of the present disclosure in one or more embodiments. In operation 301, a substrate 102 is received. Materials of the substrate 102 may be similar to those described above; therefore, repeated description is omitted. The substrate 102 may have a first surface 102F and a second surface 102B opposite to the first surface 102F. In some embodiments, the first surface 102F may be referred to as a front surface, and the second surface 102B may be referred to as a back surface.

Figure 13B:
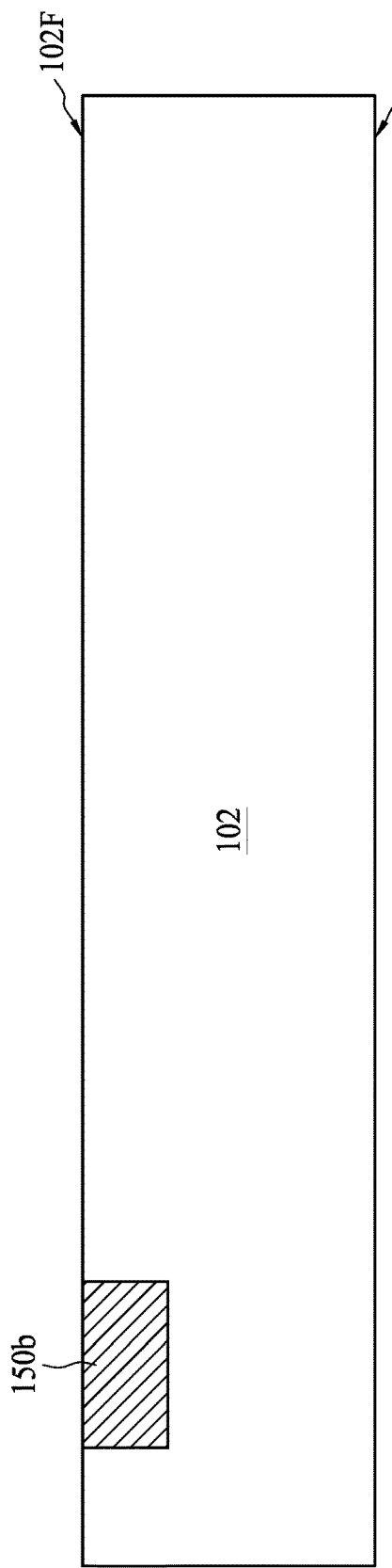
Figure 13C:
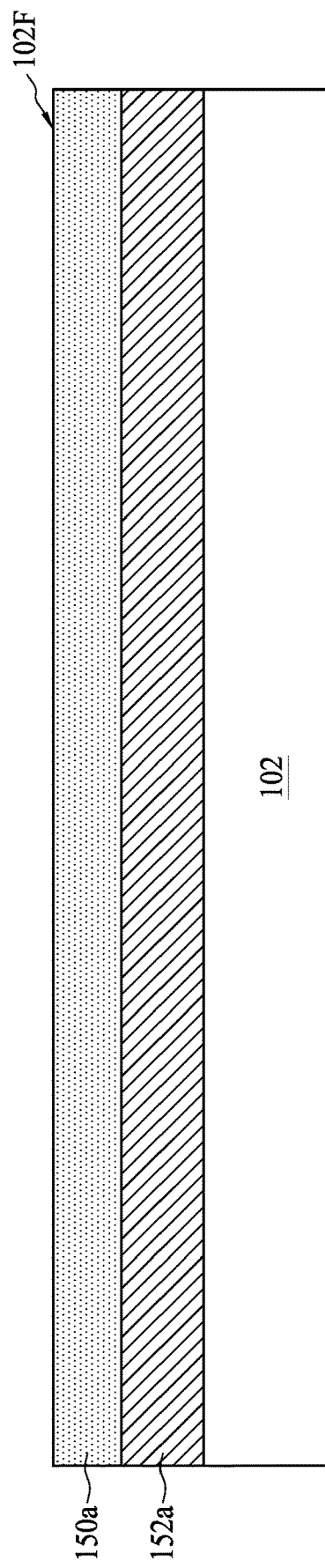

Referring to FIG. 13A to 13G in operation 302, a barrier structure is formed in the substrate 102. In some embodiments, p-type dopants or n-type dopants are blanketly implanted into the substrate 102 on the first surface 102F, and the dopants are annealed to form the barrier structure, as shown in FIG. 13A. In some embodiments, p-type dopants or n-type dopants are locally implanted and annealed to form a localized barrier structure (i.e., the doped region 150b), as shown in FIG. 13B. In some embodiments, the barrier structure includes two doped regions 150a and 152a blanketly formed in the substrate 102, as shown in FIG. 13C. In some embodiments, the barrier structure includes two doped regions 150b and 152b locally formed in the substrate 102, as shown in FIG. 13D. In some embodiments, the barrier structure includes a doped region 150 blanketly formed in the substrate 102 and doped regions 154-1 and 154-2 locally formed over the doped region 150a, and in contact with the doped region 150a, as shown in FIG. 13E. As mentioned above, the doped regions 150a, 154-1 and 154-2 may include dopants of a same conductivity type. The doped region 150a may include dopants with a conductivity type complementary to that of the doped regions 154-1 and 154-2. In other embodiments, the doped regions 154-1 and 154-2 may include dopants of conductivity types complementary to each other. In some embodiments, the barrier structure includes a doped region 150 blanketly formed in the substrate 102 and doped regions 156-1 and 156-2 locally formed over the doped region 150a, and separated from the doped region 150a, as shown in FIG. 13F. As mentioned above, the doped regions 150a, 156-1 and 156-2 may include dopants of a same conductivity type. The doped region 150a may include dopants with a conductivity type complementary to that of the doped regions 156-1 and 156-2. In other embodiments, the doped regions 156-1 and 156-2 may include dopants of conductivity types complementary to each other. In some embodiments, the barrier structure may include the doped region 150a, the doped regions 154-1 and 154-2, and the doped regions 156-1 and 156-2, as shown in FIG. 13G. Dopants in the doped region 150a, the doped regions 154-1 and 154-2, and the doped regions 156-1 and 156-2 may have various combinations, but such details are omitted for brevity.

Additionally, the barrier structure may include the doped regions 154-1 and 154-2 and the doped regions 156-1 and 156-2, as described above, and the doped region 150b. In other embodiments, the barrier structure may include the doped regions 154-1 and 154-2 and the doped regions 156-1 and 156-2, as described above, and the doped regions 150a and 152a. In still other embodiments, the barrier structure may include the doped regions 154-1 and 154-2 and the doped regions 156-1 and 156-2, as described above, and the doped regions 150b and 152b.

Figure 14:
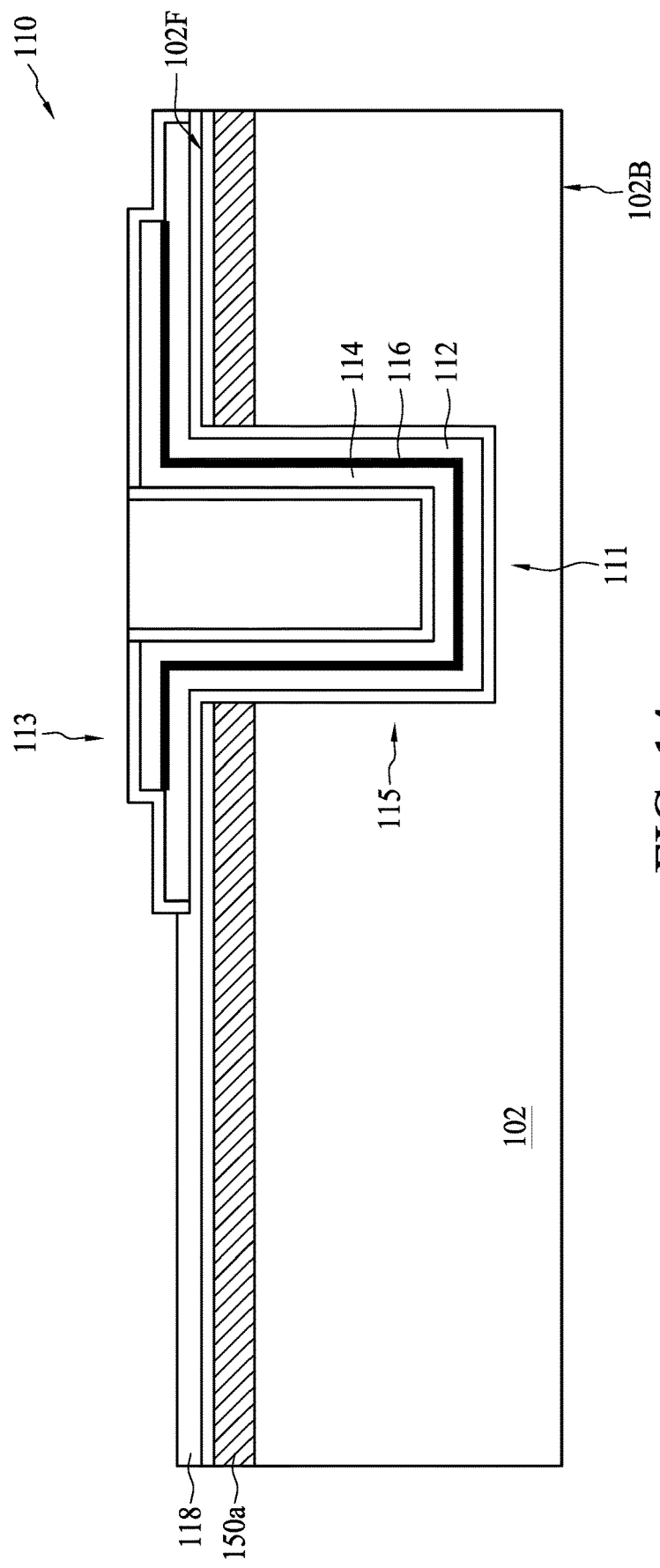
FIGS. 14 to 15E are schematic drawings illustrating a portion of a semiconductor package structure in various stages according to aspects of the present disclosure in one or more embodiments.

Referring to FIG. 14, in operation 303, a capacitor 110 is formed in the substrate 102 over the first surface 102F. In some embodiments, a trench (not shown) is formed in the substrate 102, and an insulating layer 118 is formed to line a bottom and sidewalls of the trench. The capacitor 110 including a first electrode 112, a dielectric layer 116 and a second electrode 114 is formed in the trench. As mentioned above, the capacitor 110 includes a first portion 111 disposed in the bottom of the trench, a second portion 113 disposed over the first surface 102F of the substrate 102, and a third portion 115 coupled to the first portion 111 and the second portion 113. Additionally, the first and second portions 111 and 113 may be referred to as horizontal portions, and the third portion 115 may be referred to as a vertical portion.

Figure 15A:
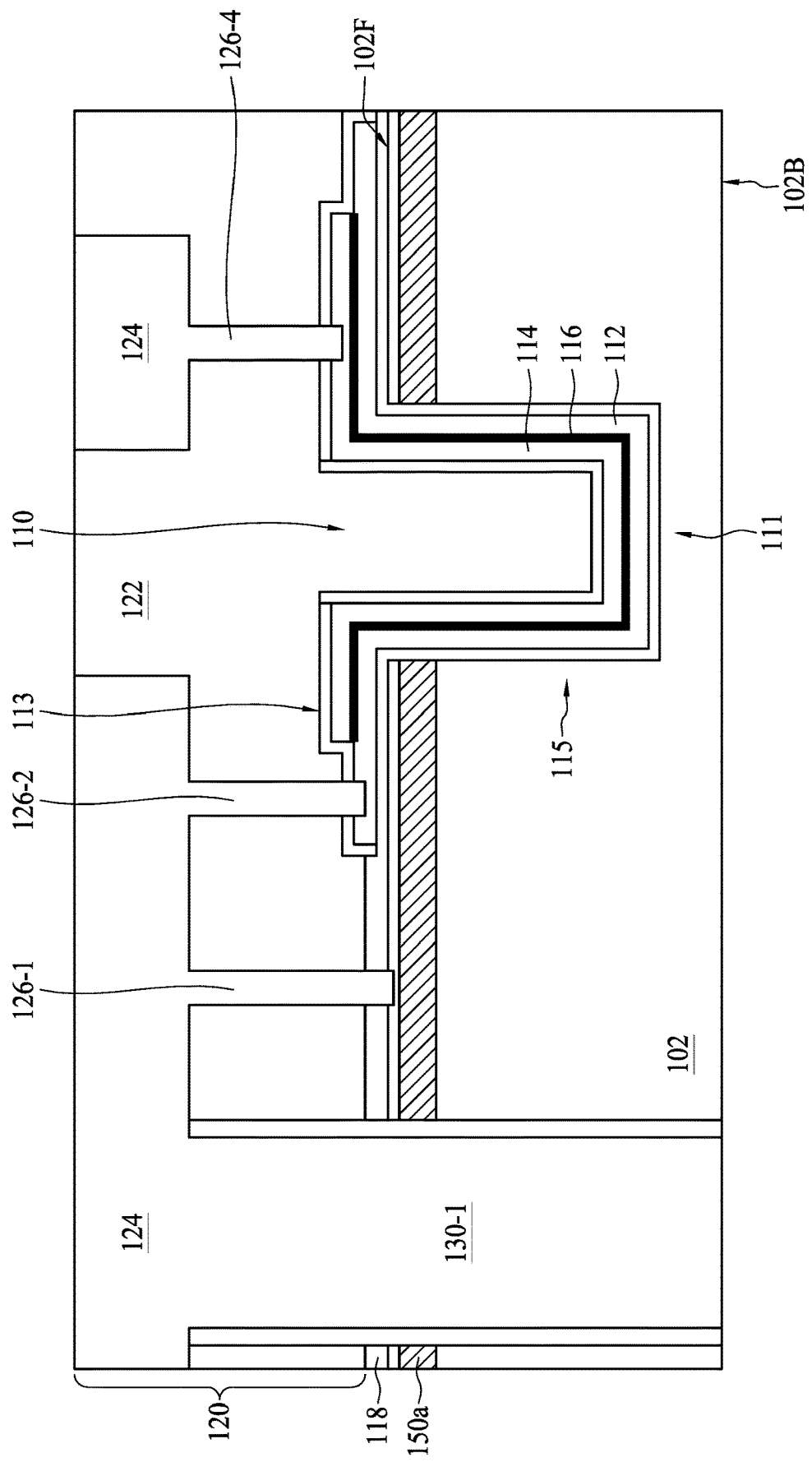
Figure 15B:
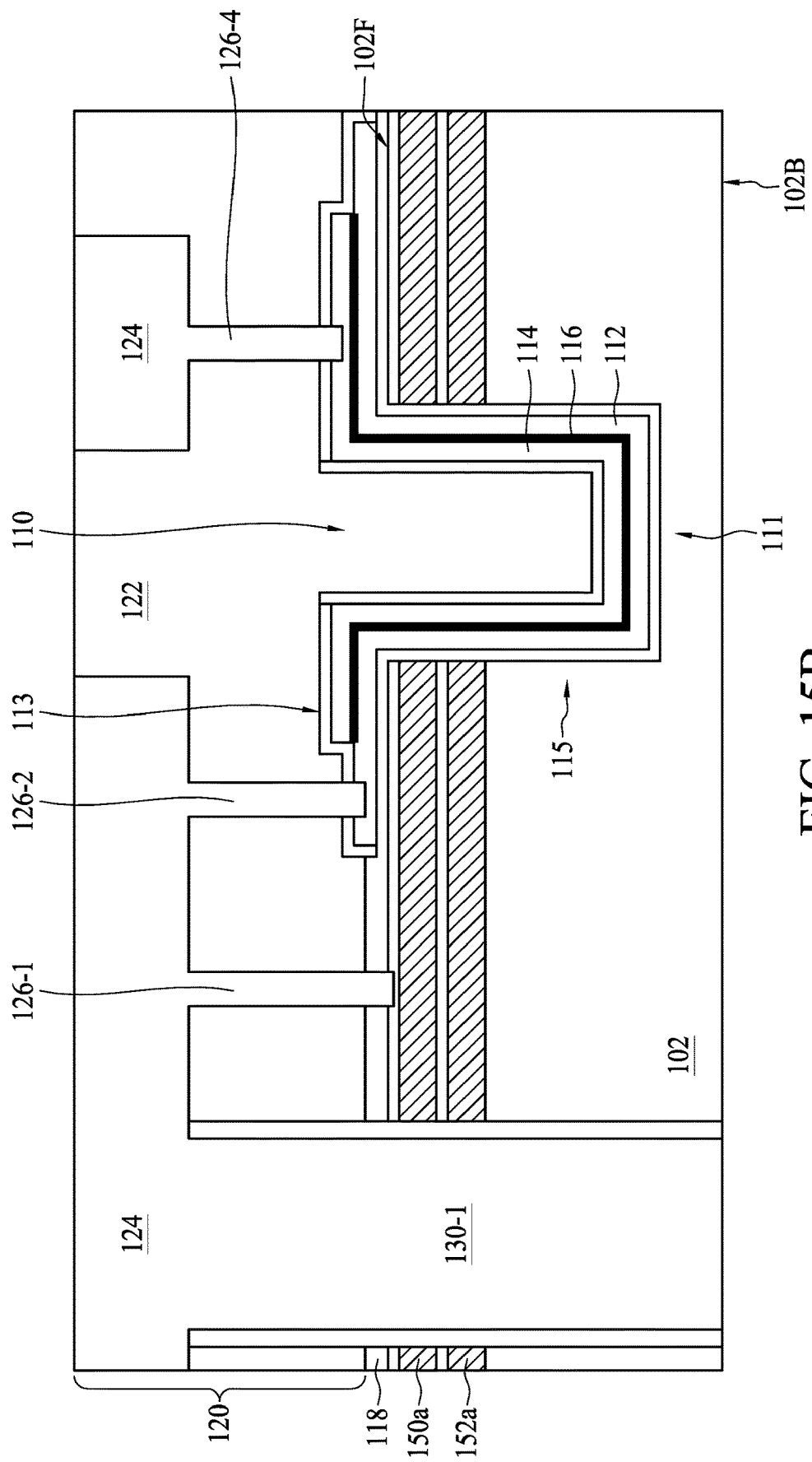
Figure 15C:
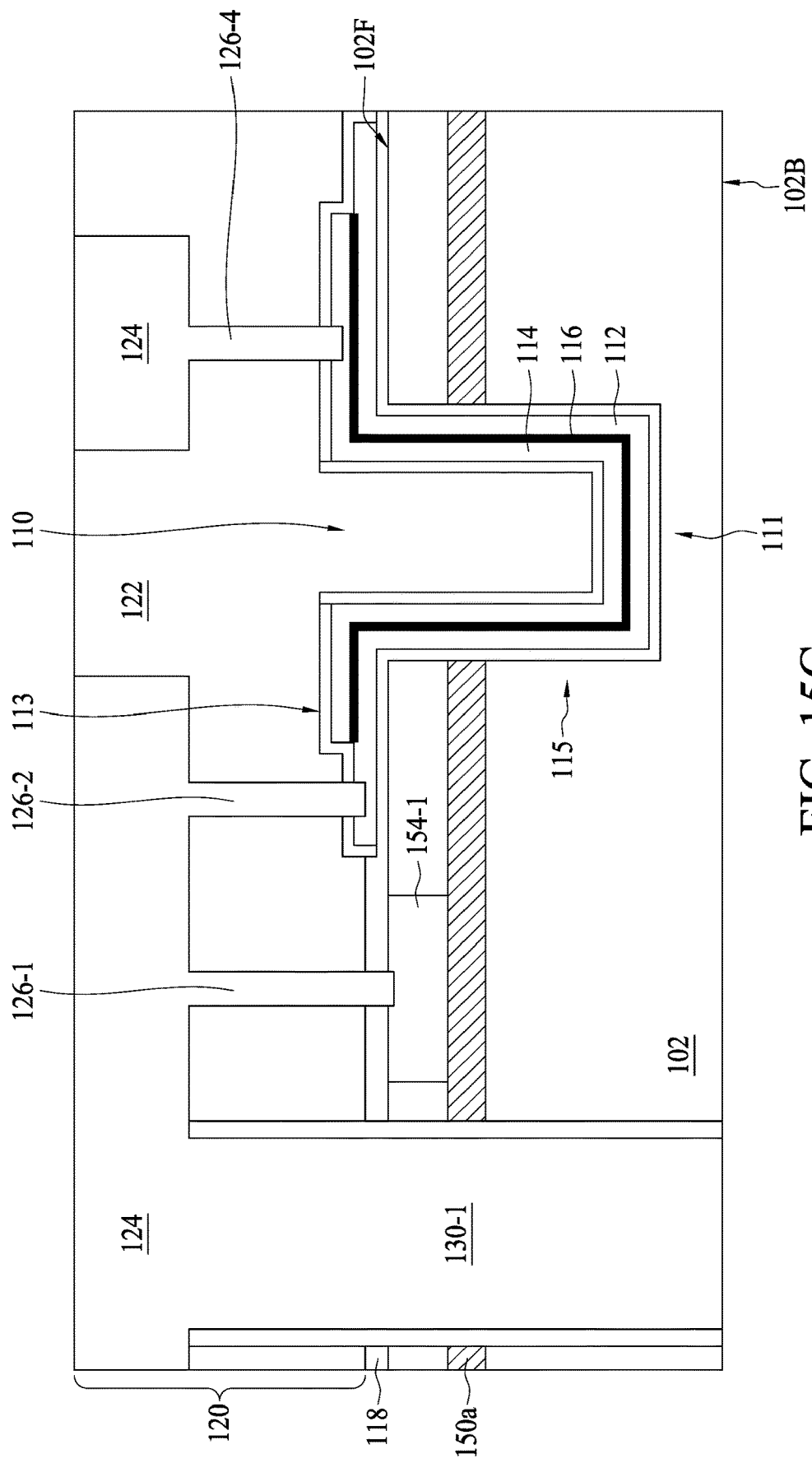
Figure 15D:
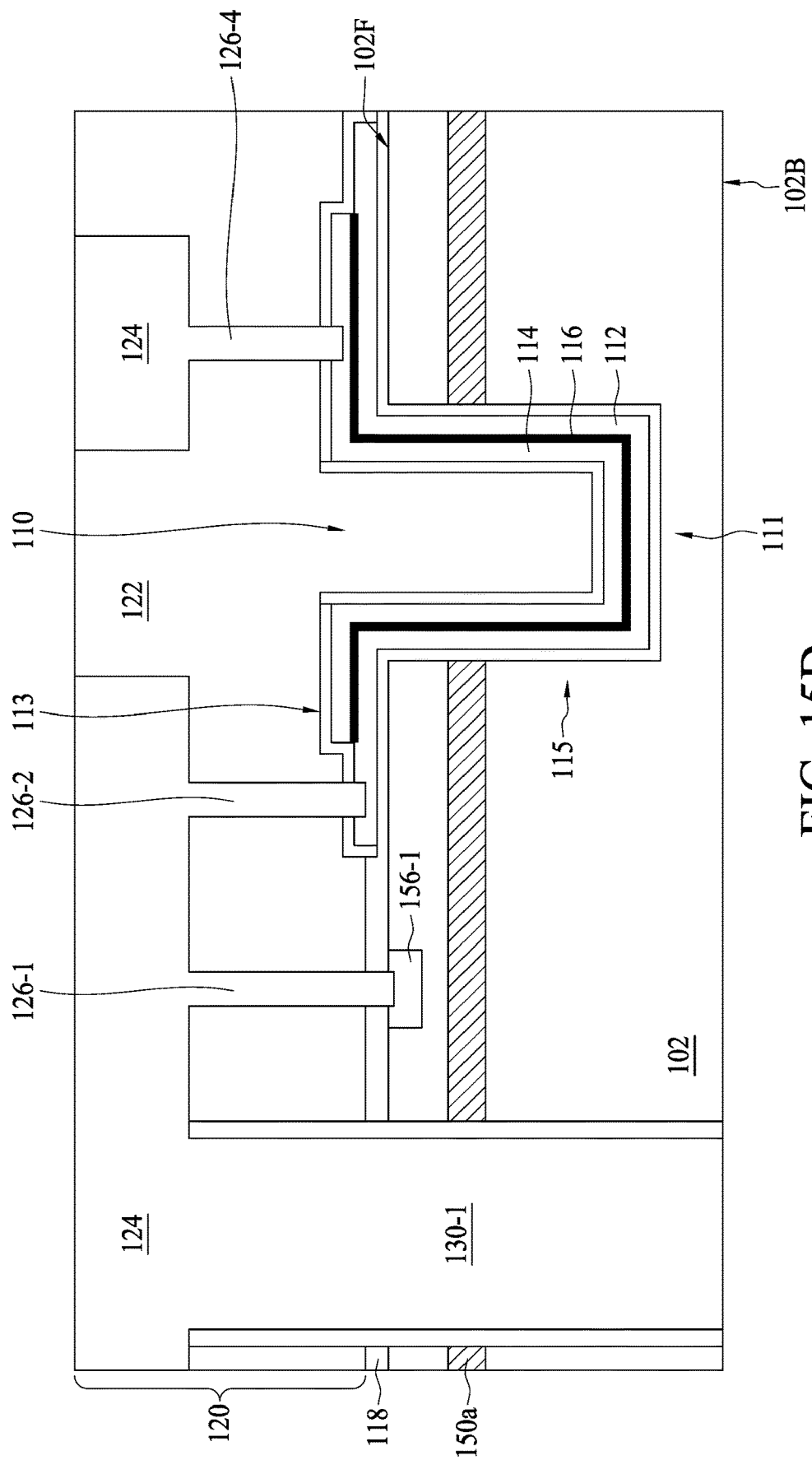
Figure 15E:
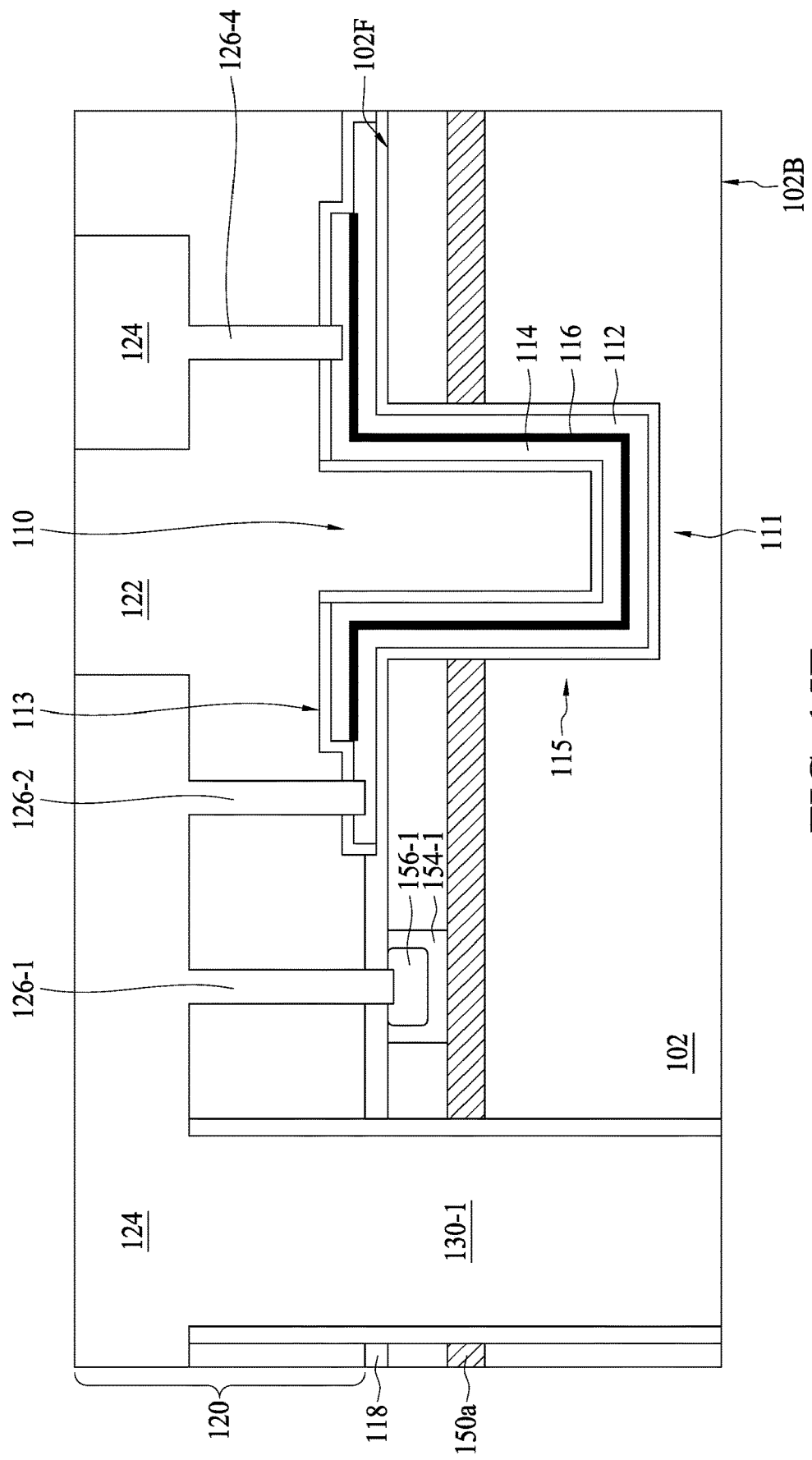

Referring to FIG. 15A, in operation 304, an interconnect structure 120 is formed over the first surface 102F of the substrate 102. The interconnect structure 120 includes an insulating layer 122. The insulating layer 122 may be a multi-layered structure, though not shown. A plurality of conductive lines 124 are formed in the insulating layer 122 and a plurality of via structures 126-1, 126-2, 126-3 (not shown) and 126-4, are disposed to couple to the conductive lines 124. Relationships between the via structures 126-1, 126-2. 126-3 and 126-4 may be similar to those in configurations described above; therefore, details ire omitted for brevity.

Referring to FIGS. 15A to 15E, in operation 305, TV structures 130-1 and 130-2 (not shown) are formed in the substrate 102. In some embodiments, through holes (not show % n) are formed from the second surface 102B to the first surface 102F of the substrate 102. In some embodiments, barrier layers are provided to line sidewalls of the through holes, and conductive materials are provided to fill the through holes. A planarization is performed on the second surface 102B of the substrate 102 to remove superfluous conductive materials to form the TV structures 130-1 and 130-2.

In some embodiments, conductive residue may be observed over the back surface 102B of the substrate 102 due to a galvanic effect even after the planarization. The conductive residue causes further problems. For example, an insulating layer 104 formed over the back surface 102B of the substrate 102 may not completely cover the back surface 102B of the substrate 102. As a result, a portion of the substrate 102 may be exposed, as shown in FIGS. 1 to 4. The exposed portion of the substrate 102 may be in contact with the conductor 146-1 or 146-2, as shown in FIGS. 1 to 4. As mentioned above, a leakage path may be formed.

According to the embodiments shown in FIGS. 15A to 15E, the barrier structure formed by the doped region(s) helps to obstruct a leakage current. Accordingly, the leakage issue is mitigated.

The present disclosure therefore provides a semiconductor structure to mitigate the leakage issue. In some embodiments, at least a doped region is formed around a connecting structure, which is electrically connected to a substrate where a MOM capacitor is formed. The doped region serves as a barrier, such that the leakage path may be blocked. Consequently, the leakage issue is mitigated.

In some embodiments, a semiconductor structure is provided. The semiconductor structure includes a substrate, a capacitor disposed in the substrate, an interconnect structure disposed over the substrate, and a first doped region disposed in the substrate. The interconnect structure includes a first via structure coupled to the substrate, and a second via structure coupled to the capacitor. The first doped region is disposed under the first via structure. The first doped region includes p-type or n-type dopants.

In some embodiments, a semiconductor structure is provided. The semiconductor structure includes an interposer substrate having a first surface and a second surface opposite to the first surface, a capacitor disposed over the first surface, a first through via structure penetrating the interposer substrate from the first surface to the second surface, a second through via structure penetrating the interposer substrate from the first surface to the second surface, and a barrier structure disposed in the interposer substrate. The interconnect structure includes a via structure coupled to the interposer substrate. The first through via structure is electrically connected to the capacitor. The second through via structure is electrically connected to the capacitor and separated from the first through via structure. The barrier structure includes at least a doped region.

In some embodiments, a method for forming a semiconductor structure is provided. The method includes following operations. A substrate is received. The substrate has a first surface and a second surface opposite to the first surface. A barrier structure is formed in the substrate near the first surface. A capacitor is formed in the substrate over the first surface. An interconnect structure is formed over the first surface of the substrate. The interconnect structure includes a first via structure coupled to the substrate, and a second via structure coupled to the capacitor. At least a through via structure is formed to penetrate the substrate from the second surface to the first surface. The through via structure is electrically connected to the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   receiving a substrate having a first surface and a second surface opposite to the first surface;
   forming a barrier structure in the substrate near the first surface;
   forming a capacitor in the substrate over the first surface, wherein a portion of the capacitor overlaps the barrier structure and separated from the barrier structure;
   forming an interconnect structure over the first surface of the substrate, wherein the interconnect structure comprises a first via structure coupled to the substrate, and a second via structure coupled to the capacitor; and
   forming at least a through via structure penetrating the substrate from the second surface to the first surface, wherein the through via structure is electrically connected to the interconnect structure.

2. The method of claim 1, wherein the forming of the barrier structure comprises forming a doped region in the substrate, and the doped region comprises p-type dopants or n-type dopants.

3. A method for forming a semiconductor structure, comprising:
   forming a doped region in a semiconductor substrate;
   forming a capacitor in the semiconductor substrate, wherein the capacitor is separated from the doped region, and the forming of the capacitor further comprises:
     forming a trench in the semiconductor substrate;
     forming an insulating layer over a bottom and sidewalls of the trench;
     forming a first electrode over the insulating layer;
     forming a dielectric layer over the first electrode; and
     forming a second electrode over the dielectric layer;
   forming an interconnect structure over the semiconductor substrate, wherein the interconnect structure comprises a first via structure coupled to the semiconductor substrate, and a second via structure coupled to the capacitor; and
   forming at least a through via structure penetrating the semiconductor substrate, wherein the through via structure is electrically connected to the interconnect structure.

4. The method of claim 3, wherein the capacitor comprises a first portion over the bottom of the trench, a second portion over a surface of the semiconductor substrate, and a third portion coupled to the first portion and the second portion.

5. The method of claim 4, wherein the doped region laterally surrounds the third portion of the capacitor.

6. The method of claim 4, wherein a thickness of the doped region is less than a height of the third portion of the capacitor.

7. The method of claim 3, wherein the first via structure is separated from the doped region.

8. The method of claim 3, wherein the first via structure is electrically connected to the second via structure.

9. A method for forming a semiconductor structure, comprising:
   receiving a substrate having a first surface and a second surface opposite to the first surface;
   forming a doped layer in the substrate near the first surface;
   forming a capacitor in the substrate and over the first surface of the substrate;
   forming a first via structure coupled to the substrate, and a second via structure coupled to the capacitor; and
   forming at least a through via structure penetrating the substrate from the second surface to the first surface, wherein the doped layer is separated from the capacitor and the through via structure.

10. The method of claim 9, wherein a thickness of the doped layer is less than a height of the capacitor, and less than a height of the through via structure.

11. The method of claim 9, wherein the forming of the through via structure further comprising:
- forming a through hole penetrating the substrate from the second surface to the first surface;
- forming a barrier layer over sidewalls of the through hole; and
- forming the through via structure in the through hole.

12. The method of claim 9, wherein the first via structure is disposed between the through via structure and the second via structure.

13. The method of claim 12, wherein a width of the doped layer is greater than a distance between the first via structure and the through via structure.

14. The method of claim 12, wherein a width of the doped layer is greater than a distance between the first via structure and the second via structure.

15. The method of claim 9, wherein the first via structure and the second via structure are electrically connected to each other through a conductive line.

16. The method of claim 15, wherein the through via structure is electrically connected to the first via structure and the second via structure through the conductive line.

17. The method of claim 9, wherein the first via structure is separated from the doped layer by an insulating layer.

18. The method of claim 1, wherein the interconnect structure comprises a third via structure coupled to the capacitor, and the third via structure is separated from the first structure and the second via structure.

19. The method of claim 1, wherein the interconnect structure comprises a conductive line, and the first via structure and the second via structure are coupled to the conductive line.

20. The method of claim 19, wherein the through via structure is coupled to the conductive line.

* * * * *